United States Patent [19]
Kobayashi et al.

[11] Patent Number: 5,977,564
[45] Date of Patent: Nov. 2, 1999

[54] SEMICONDUCTOR DEVICE

[75] Inventors: Setsuko Kobayashi, Yokohama; Takashi Shinohe, Yokosuka; Tomoki Inoue, Tokyo; Akihiro Yahata, Yokohama, all of Japan

[73] Assignee: Kabushiki Kaisha Toshiba, Kawasaki, Japan

[21] Appl. No.: 08/951,674

[22] Filed: Oct. 16, 1997

[30] Foreign Application Priority Data

Oct. 16, 1996 [JP] Japan .................................. 8-273407
Mar. 18, 1997 [JP] Japan .................................. 9-065054
Oct. 14, 1997 [JP] Japan .................................. 9-280588

[51] Int. Cl.[6] .................... H01L 31/0312; H01L 29/06; H01L 29/04
[52] U.S. Cl. .......................... 257/77; 257/18; 257/22; 257/628
[58] Field of Search ................... 257/14, 15, 17, 257/18, 22, 627, 628, 77

[56] References Cited

U.S. PATENT DOCUMENTS 5,436,468  7/1995  Nakata et al. ............................ 257/15

FOREIGN PATENT DOCUMENTS 7-131016  5/1995  Japan .
8-8429    1/1996  Japan .

OTHER PUBLICATIONS

James E. Chung, et al. "The Effects of Low–Angle Off–Axis Substrate Orientation on MOSFET Performance and Reliability", IEEE Transactions on Electron Devices, vol. 38, No. 3, Mar. 1991, pp. 627–633.

Primary Examiner—Minh Loan Tran
Assistant Examiner—Ori Nadav
Attorney, Agent, or Firm—Oblon, Spivak, McClelland, Maier & Neustadt, P.C.

[57] ABSTRACT

A semiconductor device includes a first semiconductor layer of a first conductivity type, a second semiconductor layer of the first conductivity type formed on the surface of the first semiconductor layer, the energy difference between the bottom of the conductive band and the vacuum level in the second semiconductor layer being smaller than that in the first semiconductor layer, a gate electrode formed above the second semiconductor layer with a gate insulating film interposed therebetween, and a pair of third semiconductor layers of the second conductivity type, being in contact with at least the first semiconductor layer and faced each other in a region of the surface of the first semiconductor layer, so that a channel region is formed under the gate electrode.

3 Claims, 12 Drawing Sheets

SEMICONDUCTOR DEVICE

BACKGROUND OF THE INVENTION

The present invention relates to a semiconductor device including a device region formed in an epitaxial layer, and more particularly to a semiconductor device formed of a material, such as SiC, which is liable to cause surface scattering.

Conventionally, MOS transistors are generally used in semiconductor devices. In particular, Si-based MOS transistors are used in various types of semiconductor devices.

There is a demand for an MOS transistor, wherein the withstand voltage is high and the base is thin, to be used in semiconductor devices having a high withstand voltage. As an MOS transistor which meets the demand, a SiC-based MOS transistor is expected, since the thickness of a SiC-based MOS transistor for a given voltage can be about 1/10 of that of a Si-based MOS transistor.

However, this type of MOS transistor has the following drawback: the mobility of carriers in a channel region (channel mobility) is much lower than that in the bulk SiC, resulting in high ON resistance.

The cause of the drawback is as follows. Since SiC cannot be easily polished by chemical mechanical polishing (CMP), great roughness remains on the surface of SiC after polishing. For this reason, when a gate oxide film is formed on the surface of SiC polished to a predetermined thickness, the channel mobility is reduced by surface-roughness scattering on the interface between the gate oxide film and SiC. Further, a number of dangling bonds due to the lattice structure exist on the surface of SiC, so that the channel mobility is reduced by coulomb scattering on the MOS interface. As a result, the channel mobility is very low, and the ON resistance is high.

In general, to grow an epitaxial layer, the semiconductor substrate is polished so that the substrate is misoriented θ degree from the low index direction axis, and an epitaxial layer is formed on the polished off-axis surface of the substrate. This is because a monocrystalline layer including few crystal defects can be obtained by forming a step structure on the surface of a substrate and epitaxially growing monocrystal on the step surface. However, it is known that the greater the off-axis angle θ, the lower the effective channel mobility due to scattering caused by the steps, and the greater the ON resistance.

If the substrate is made of Si, since the off-axis angle is generally set smaller than 1°, the number of steps is small. Hence, the channel mobility is not practically reduced. However, in the case of SiC, the off-axis angle is set to about 4° for step-controlled epitaxy and the steps are steep due to a characteristic periodical structure of the hexagonal system. As a result, the step density becomes large and thus considerable scattering occurs. Thus, the effective channel mobility is reduced to an extent which cannot practically be ignored, and the ON resistance is increased.

Further, if the surface of the epitaxial layer makes an angle with a crystal surface along a low index number direction macroscopically, and if a trench is formed without taking the direction thereof into consideration, the side wall of the trench is inevitably deviated from the crystal surface along the low index number direction. As a result, the lattice structure on the side wall is disordered and a number of dangling bonds are generated. For this reason, when a current path is formed on the side wall of the trench, the following problem is raised: the surface scattering becomes greater due to surface-roughness scattering and coulomb scattering, and the ON resistance is increased.

BRIEF SUMMARY OF THE INVENTION

An object of the present invention is to provide an insulated-gate type semiconductor device wherein the channel mobility can be prevented from decreasing, even if the substrate is made of a material such as SiC, in which great roughness and a number of dangling bonds are generated on the surface thereof.

Another object of the present invention is to provide a semiconductor device having a small ON resistance, which is formed on a monocrystalline semiconductor layer epitaxially grown on a semiconductor substrate polished to have a tilt angle to the low index number direction axis.

To achieve the aforementioned objects, a semiconductor device according to a first aspect of the present invention comprises: a first semiconductor layer of a first conductivity type having a surface; a second semiconductor layer of the first conductivity type formed on the surface of the first semiconductor layer, the energy difference between the bottom of a conductive band and the vacuum level in the second semiconductor layer being smaller than that in the first semiconductor layer; a gate electrode formed above the second semiconductor layer with a gate insulating film interposed therebetween; and a pair of third semiconductor layers of the second conductivity type, being in contact with at least the first semiconductor layer and faced each other in a region of the surface of the first semiconductor layer, so that a channel region is formed under the gate electrode.

The second semiconductor layer may be formed only under the gate electrode.

In the semiconductor device, one of the third semiconductor layers may be made of a semiconductor substrate of the second conductivity type; the first semiconductor layer may be formed on the semiconductor substrate; the other of the third semiconductor layers may be formed on the first semiconductor layer; the second semiconductor layer may be formed on an inner surface of a trench extending from a surface of the other of the third semiconductor layer to the semiconductor substrate; and the gate electrode may be buried in the trench with the gate insulating film interposed therebetween.

The second semiconductor layer may be formed only on the portion of the first semiconductor layer exposed to the trench.

It is preferable that the first and second semiconductor layers be made of materials selected from the group consisting of combinations: (4H—SiC, GaN); (4H—SiC, Diamond); (6H—SiC, 4H—SiC); (6H—SiC, GaN); (6H—SiC, Diamond); (3C—SiC, 4H—SiC); (3C—SiC, 6H—SiC); (3C—SiC, GaN); and (3C—SiC, Diamond).

According to the present invention, the gate insulating film is not directly formed on the first semiconductor layer, but on the second semiconductor layer formed on the first semiconductor layer. In addition, near the channel region defined by the gate electrode, the energy difference between the bottom of the conductive band and the vacuum level in the second semiconductor layer is smaller than that in the first semiconductor layer.

Therefore, when a voltage exceeding the threshold voltage is applied to the gate electrode, a channel of the second conductivity type is formed near the interface between the first and second semiconductor layers, and not near the interface between the gate insulating film and the second semiconductor layer (MOS interface). Therefore, even if the second semiconductor layer is made of SiC, in which a number of dangling bonds are formed in the interface between the gate insulating film and the second semiconductor layer, the reduction in carrier mobility can be suppressed.

A semiconductor device according to a second aspect of the present invention comprises: a first semiconductor layer of a first conductivity type; a second semiconductor layer of the first conductivity type formed on the first semiconductor layer, the energy difference between the bottom of the conductive band and the vacuum level in the second semiconductor layer being smaller than that in the first semiconductor layer; a gate electrode formed above the second semiconductor layer with a gate insulating film interposed therebetween; a first diffusion layer of the first conductivity type formed on one side of the gate electrode, the first diffusion layer extending from a surface of the second semiconductor layer to the first semiconductor layer; and a second diffusion layer of the second conductivity type continuously formed in the first and second semiconductor layers, the second diffusion layer including a portion under the gate electrode and surrounding the first diffusion layer.

The semiconductor device may further comprise a third semiconductor layer of the first conductivity type, on which the first semiconductor layer is formed, a carrier mobility in the first semiconductor layer being higher than that in the third semiconductor layer.

It is preferable that the semiconductor device may comprise a third diffusion layer of the first conductivity type extending from a surface of the second semiconductor layer on the other side of the gate electrode to the first semiconductor layer.

It is preferable that the first and second semiconductor layers be made of materials selected from the group consisting of combinations: (4H—SiC, GaN); (4H—SiC, Diamond); (6H—SiC, 4H—SiC); (6H—SiC, GaN); (6H—SiC, Diamond); (3C—SiC, 4H—SiC); (3C—SiC, 6H—SiC); (3C—SiC, GaN); and (3C—SiC, Diamond).

A semiconductor device according to a third aspect of the present invention comprises: a first semiconductor layer of a first conductivity type having a surface; a second semiconductor layer of the first conductivity type formed on the surface of the first semiconductor layer, the carrier mobility in the second semiconductor layer being higher than that in the first semiconductor layer; a gate electrode formed above the second semiconductor layer with a gate insulating film interposed therebetween; and a pair of third semiconductor layers of the second conductivity type, being in contact with at least the first semiconductor layer and faced each other in a region of the surface of the first semiconductor layer, so that a channel region is formed under the gate electrode.

In the semiconductor device, one of the third semiconductor layers may be made of a semiconductor substrate of the second conductivity type; the first semiconductor layer may be formed on the semiconductor substrate; the other of the third semiconductor layers may be formed on the first semiconductor layer; the second semiconductor layer may be formed on an inner surface of a trench extending from a surface of the other of the third semiconductor layers to the semiconductor substrate; and the gate electrode may be buried in the trench with the gate insulating film interposed therebetween.

The second semiconductor layer may be formed only on a portion of the first semiconductor layer exposed to the trench.

It is preferable that the first semiconductor layer be a doped layer of a predetermined concentration and the second semiconductor layer be an undoped layer.

According to the present invention, the gate insulating film is not directly formed on the first semiconductor layer, but on the second semiconductor layer formed on the first semiconductor layer. In addition, near the channel region defined by the gate electrode, the carrier mobility in the second semiconductor layer is higher than that in the first semiconductor layer.

The channel is formed near the interface between the gate insulating film and the second semiconductor layer which has a high carrier mobility. Therefore, even if the first semiconductor layer is made of SiC, in which great roughness and a number of dangling bonds are generated on the surface thereof, the channel having an improved flatness is formed near the interface between the gate insulating film and the second semiconductor layer wherein less dangling bonds are generated. Thus, the reduction in carrier mobility can be suppressed.

A semiconductor device according to a fourth aspect of the present invention comprises: a first semiconductor layer of a first conductivity type; a second semiconductor layer of the first conductivity type formed on the first semiconductor layer, the carrier mobility in the second semiconductor layer being higher than that in the first semiconductor layer; a third semiconductor layer of the first conductivity type formed on the second semiconductor layer, the energy difference between the bottom of the conductive band and the vacuum level in the third semiconductor layer being smaller than that in the second semiconductor layer; a gate electrode formed above the third semiconductor layer with a gate insulating film interposed therebetween; and a pair of fourth semiconductor layers of the second conductivity type, being in contact with at least the first and second semiconductor layer and faced each other at least in a region of the first semiconductor layer, so that a channel region is formed under the gate electrode.

In the semiconductor device, one of the fourth semiconductor layers may be made of a semiconductor substrate of the second conductivity type; the first semiconductor layer may be formed on the semiconductor substrate; the other of the fourth semiconductor layers may be formed on the first semiconductor layer; the second semiconductor layer may be formed on an inner surface of a trench extending from a surface of the other of the fourth semiconductor layer to the semiconductor substrate; the third semiconductor layer may be formed in the trench to cover the second semiconductor layer; and the gate electrode may be buried in the trench with the gate insulating film interposed therebetween.

The second and third semiconductor layers may be formed only on the portion of the first semiconductor layer exposed to the trench.

It is preferable that the energy difference between the bottom of the conductive band and the vacuum level in the second semiconductor layer be equal to or smaller than that in the semiconductor substrate. It is preferable that the first semiconductor layer be a doped layer of a predetermined concentration and the second semiconductor layer be an undoped layer.

It is preferable that the first, second and third semiconductor layers be made of materials selected from the group consisting of combinations: (4H—SiC, Si, 4H—SiC); (6H—SiC, Si, 6H—SiC); (4H—SiC, Si, GaN); (4H—SiC, Si, Diamond); (6H—SiC, Si, GaN); (6H—SiC, Si, Diamond); (3C—SiC, Si, GaN); (3C—SiC, Si, Diamond); and (3C—SiC, Si, 3C—SiC).

According to the present invention, the gate insulating film is not directly formed on the first semiconductor layer, but above the first semiconductor layer with the second and third semiconductor layers interposed therebetween. In addition, near the channel region defined by the gate electrode, the energy difference between the bottom of the conductive band and the vacuum level in the third semiconductor layer is smaller than that in the second semiconductor layer.

Therefore, when a voltage exceeding the threshold voltage is applied to the gate electrode, a channel of the second conductivity type is formed near the interface between the second semiconductor layer having a high carrier mobility and the third semiconductor layer, and not near the interface between the gate insulating film and the third semiconductor layer. Therefore, even if the first semiconductor layer is made of SiC, in which great roughness and a number of dangling bonds are generated on the surface thereof, the reduction in carrier mobility can be suppressed.

The fourth aspect of the present invention is different from the first aspect, in that the carriers flow into the second semiconductor layer (e.g., Si layer) wherein the mobility is higher than that in the first or third semiconductor layer. Therefore, according to the fourth aspect, the effect of the first aspect of the present invention is further improved.

A semiconductor device according to a fifth aspect of the present invention comprises: a first semiconductor layer of a first conductivity type having a projection on a surface thereof; a second semiconductor layer of a second conductivity type formed on the projection of the first semiconductor layer, a carrier mobility in the second semiconductor layer being higher than that in the first semiconductor layer; a third semiconductor layer of the first conductivity type formed on the second semiconductor layer; and a gate electrode formed on side surfaces of the projection of the first semiconductor layer, the second semiconductor layer and the third semiconductor layer with a gate insulating film interposed therebetween.

It is preferable that the first semiconductor layer be made of SiC and the second and third semiconductor layers be made of Si.

A semiconductor device according to a sixth aspect of the present invention comprises a semiconductor substrate polished to have a tilt angle in a preset direction normal to the low index number direction axis; a monocrystalline semiconductor layer epitaxially grown on the semiconductor substrate; and a device region formed on a surface of the monocrystalline semiconductor layer in which a direction of the path of the current to be controlled is substantially perpendicular to the preset normal direction.

In the semiconductor device according to the sixth aspect, a current path of the device is formed so that the current flows substantially parallel to the vertical surface of the stepped structure generated on the epitaxial layer by polishing the substrate off-axis. For this reason, scattering of electrons and holes are prevented more sufficiently as compared to the case in which the current flows perpendicular to the vertical surface of the stepped structure.

The semiconductor device according to the sixth aspect may comprise: a semiconductor substrate polished to have a tilt angle in a preset direction normal to the low index number direction axis; a monocrystalline semiconductor layer epitaxially grown on the semiconductor substrate; and a device region formed on a surface of the monocrystalline semiconductor layer in which a path of a current to be controlled is set on a terrace between adjacent steps formed on the monocrystalline semiconductor layer.

In this case, the semiconductor device is not formed extending through the steps. Therefore, scattering of electrons or holes due to the steps is completely eliminated.

Therefore, the present invention does not have a problem of an unexpected increase in ON resistance, which may arise when the device is formed without taking account of the relationship between the direction of the step and the direction of the current to be controlled. Thus, a stable device of a low ON resistance can be formed.

The semiconductor device according to the sixth aspect may comprise: a semiconductor substrate polished to have a tilt angle in a preset direction normal to the low index number direction axis; a monocrystalline semiconductor layer epitaxially grown on the semiconductor substrate; an elongate trench formed in the monocrystalline semiconductor layer and having opposing side walls, an elongating direction of the trench being substantially parallel to the preset direction; and a device region formed on the semiconductor substrate including the elongate trench, the device region having a structure on the side walls to control a current flowing therethrough.

In this case, the semiconductor device includes an elongate trench substantially parallel to a macroscopic tilt of the epitaxial layer due to an off-axis lapping of the substrate. The side walls of the trench coincides with a low index number crystal plane, independent of the off-axis angle.

Therefore, surface roughness of the side walls and surface scattering due to dangling bonds are restrained, and a stable device of a low ON resistance can be formed.

Additional objects and advantages of the invention will be set forth in the description which follows, and in part will be obvious from the description, or may be learned by practice of the invention. The objects and advantages of the invention may be realized and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

FIGS. 19A and 19B are diagrams for explaining a hexagonal polytype, which is a typical SiC crystal structure, wherein FIG. 19A shows 6H—SiC and FIG. 19B shows 4H—SiC;

DETAILED DESCRIPTION OF THE INVENTION

At first, embodiments according to the first to fifth aspects of the present invention will now be described with reference to the accompanying drawings.

(First Embodiment)

Figure 1:
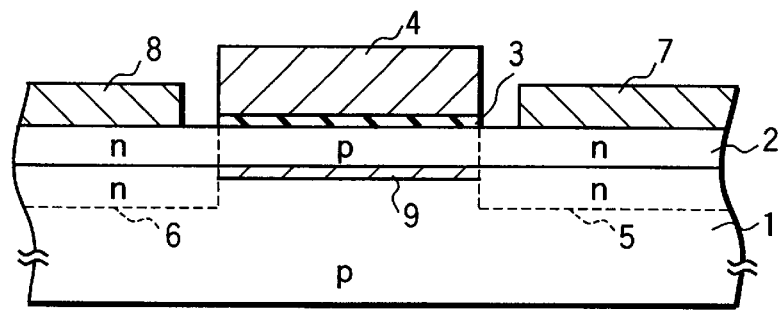
FIG. 1 is a cross-sectional view showing a device structure of an MOS transistor according to a first embodiment of the present invention.

FIG. 1 is a cross-sectional view showing a device structure of an MOS transistor according to a first embodiment of the present invention. In FIG. 1, a reference numeral 1 denotes a first p-type SiC layer made of 6H—SiC, on which a second p-type SiC layer 2 made of 4H—SiC is formed. A gate electrode 4 is formed on top of the second p-type SiC layer 2 with a gate insulating film 3 interposed therebetween.

A pair of n-type source and drain layers 5 and 6 having a high impurity concentration are formed in the first and second p-type SiC layers 1 and 2 by self-alignment to the gate electrode 4. Source and drain electrodes 7 and 8 are in contact with the n-type source and drain layers 5 and 6 with low contact resistance.

In this embodiment, the gate insulating film 3 is not directly provided on the p-type SiC layer 1: the p-type SiC layer 2 is interposed between the gate insulating film 3 and the p-type SiC layer 1.

More specifically, in a channel region defined by the gate electrode 4, the gate insulating film 3 is provided above the p-type SiC layer 1 via the p-type SiC layer 2, in which the energy difference between the bottom of the conduction band and the vacuum level is smaller than that in the p-type SiC layer 1.

Figures 2A, 2B:
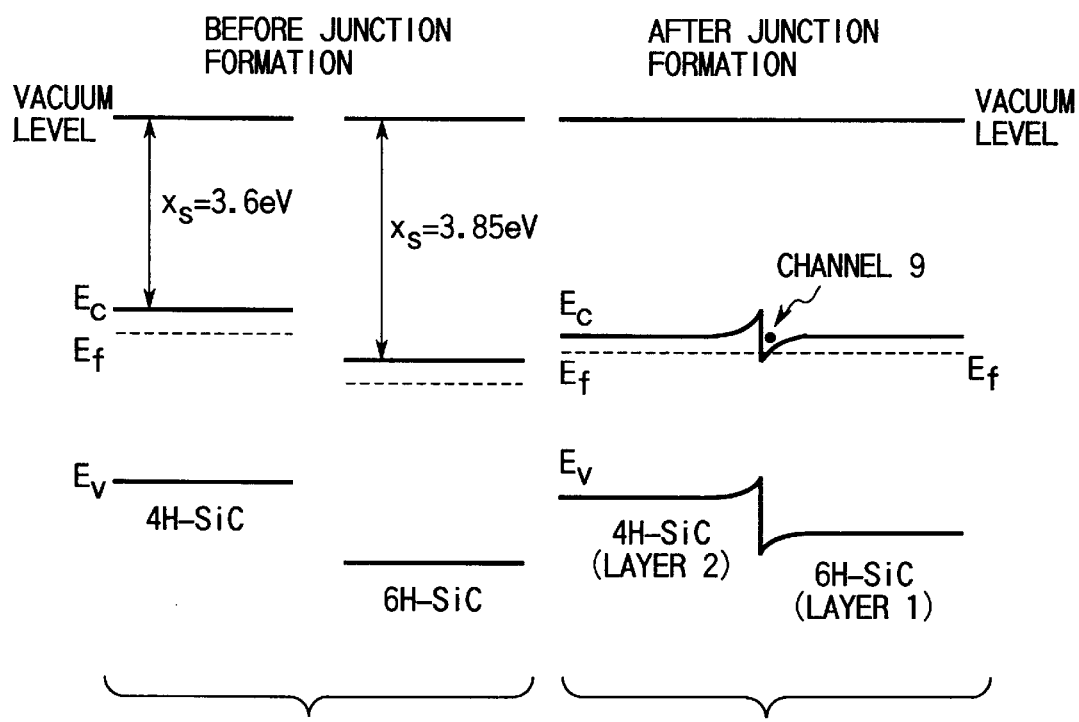
FIGS. 2A and 2B are energy band diagrams respectively showing states before and after formation of a interface between 4H—SiC and 6H—SiC.

With this structure, when a voltage exceeding the threshold voltage is applied to the gate electrode 4, an n-channel 9 is formed on the p-type SiC layer 1 near the interface between the p-type SiC layer 1 and the p-type SiC layer 2, and not near the interface (MOS interface) between the gate insulating film 3 and the p-type SiC layer 2, as shown in the energy band of FIG. 2B. Therefore, even if the substrate is made of SiC, in which a number of dangling bonds are formed in the MOS interface, the reduction in carrier mobility can be sufficiently suppressed.

As described above, the first embodiment of the present invention realizes an MOS transistor of a high channel mobility, wherein the reduction in carrier mobility due to dangling bonds is more sufficiently suppressed as compared to the conventional MOS transistor having a gate insulating film directly provided on an SiC film.

Figure 3:
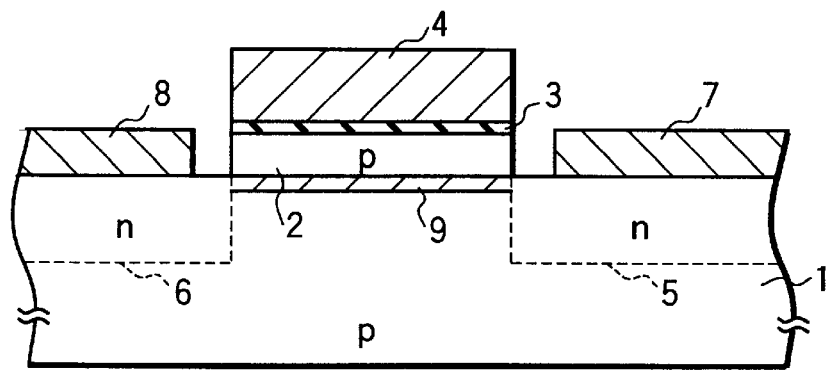
FIG. 3 is a cross-sectional view showing a device structure of an MOS transistor according to a modification of the first embodiment of the present invention.

The first embodiment can be modified as shown in FIG. 3. In the modification, a p-type SiC layer 2 is formed only under the gate electrode 4. With this structure, the same effect as described above can be obtained.

In the first embodiment, the first p-type SiC layer 1 made of 6H—SiC and the second p-type SiC layer 2 made of 4H—SiC are combined. The present invention, however, is not limited to this combination, but the modifications as shown in Table 1 indicated below are applicable.

Further, assuming that an energy difference between the bottom of a conduction band of the first semiconductor layer and a vacuum level is represented as $x_1$ and an energy difference between the bottom of a conduction band of the second semiconductor layer and a vacuum level is represented as $x_2$, the greater the difference $\Delta E$ between the energy differences ($=x_2-x_1$), the higher the carrier mobility. The difference $\Delta E$ is also indicated in Table 1.

TABLE 1

| Layer 1 | 4H—SiC | 4H—SiC | 6H—SiC | 6H—SiC | 6H—SiC |
| Layer 2 | GaN | Diamond | 4H—SiC | GaN | Diamond |
| ΔE[eV] | 0.3 | 1.3 | 0.25 | 0.55 | 1.55 |

| Layer 1 | 3C—SiC | 3C—SiC | 3C—SiC | 3C—SiC |
| Layer 2 | 4H—SiC | 6H—SiC | GaN | Diamond |
| ΔE[eV] | 0.4 | 1.15 | 0.7 | 0.7 |

In addition, according to the first embodiment, since SiC is used as a material of the substrate, it is possible to realize an MOS transistor having a thin base with a high withstand voltage. When the structure of the first embodiment is applied to a vertical MOS transistor, a particularly notable effect can be obtained (the same applies to second and subsequent embodiments).

(Second Embodiment)

Figure 4:
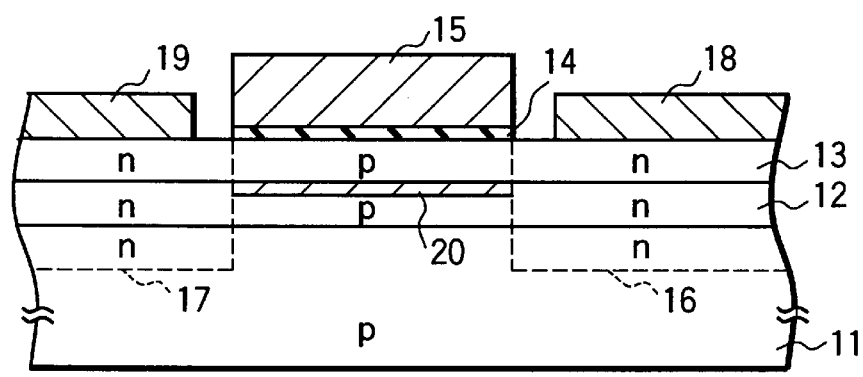
FIG. 4 is a cross-sectional view showing a device structure of an MOS transistor according to a second embodiment of the present invention.

FIG. 4 is a cross-sectional view showing a device structure of an MOS transistor according to a second embodiment of the present invention. In FIG. 4, a reference numeral 11 denotes a first p-type SiC layer made of 3C—SiC, on which a p-type Si layer 12 and a second p-type SiC layer 13 made of 3C—SiC are formed. A gate electrode 15 is formed on top of the second p-type SiC layer 13 with a gate insulating film 14 interposed therebetween.

A pair of n-type source and drain layers 16 and 17 having a high impurity concentration are formed in the first p-type SiC layer 11, the p-type Si layer 12 and the second p-type SiC layer 13 by self-alignment to the base electrode 15. Source and drain electrodes 18 and 19 are in contact with the n-type source and drain layers 16 and 17 with low contact resistance.

In this embodiment, the gate insulating film 14 is not directly provided on the p-type SiC layer 11: the p-type Si layer 12 and the p-type SiC layer 13 are interposed between the gate insulating film 14 and the p-type SiC layer 11.

More specifically, in the channel region defined by the gate electrode 15, the p-type Si layer 12 wherein the carrier mobility is higher than that in the p-type SiC layer 11 is provided and the gate insulating film 14 is provided above the p-type Si layer 12 via the p-type SiC layer 13, wherein the energy difference between the bottom of the conduction band and the vacuum level is smaller than that in the p-type Si layer 12.

With this structure, when a voltage exceeding the threshold voltage is applied to the gate electrode 15, an n-channel 20 is formed on the p-type Si layer 12 near the interface between the p-type Si layer 12 and the p-type SiC layer 13, and not near the interface (MOS interface) between the gate insulating film 14 and the p-type SiC layer 13. Therefore, even if the substrate is made of SiC, in which a number of dangling bonds are formed on the surface, the reduction in carrier mobility can be sufficiently suppressed.

As described above, the second embodiment of the present invention realizes an MOS transistor of a high channel mobility, wherein the reduction in carrier mobility due to surface roughness and dangling bonds is more sufficiently suppressed as compared to the conventional MOS transistor having a gate insulating film directly provided on an SiC film.

Further, according to the second embodiment, since the n-channel is formed in the p-type Si layer 12 having a carrier mobility higher than that in the p-type SiC layer 13, the carrier mobility can be higher than that in the first embodiment wherein the n-channel is formed in the p-type SiC layer.

In the first embodiment, the first p-type SiC layer 11 made of 3C—SiC, the p-type Si layer 12, and the second p-type SiC layer 13 made of 3C—SiC are combined. The present invention, however, is not limited to this combination, but the combinations as shown in Table 2 indicated below are applicable.

Further, assuming that the energy difference between the bottom of the conduction band of the second semiconductor layer and the vacuum level is represented as $x_2$, and the energy difference between the bottom of the conduction band of the third semiconductor layer and the vacuum level is represented as $x_3$, the greater the difference $\Delta E$ between the energy differences (=$x_3-x_2$), the higher the carrier mobility. The difference $\Delta E$ is also indicated in Table 2.

TABLE 2

| Layer 11 | 4H—SiC | 6H—SiC | 4H—SiC | 4H—SiC | 6H—SiC |
|---|---|---|---|---|---|
| Layer 12 | Si | Si | Si | Si | Si |
| Layer 13 | 4H—SiC | 6H—SiC | GaN | Diamond | GaN |
| ΔE[eV] | 0.45 | 0.2 | 0.75 | 1.75 | 0.75 |
| Layer 11 | 6H—SiC | 3C—SiC | 3C—SiC | 3C—SiC | |
| Layer 12 | Si | Si | Si | Si | |
| Layer 13 | Diamond | GaN | Diamond | 3C—SiC | |
| ΔE[eV] | 1.75 | 0.75 | 1.75 | 0.05 | |

Figure 5:
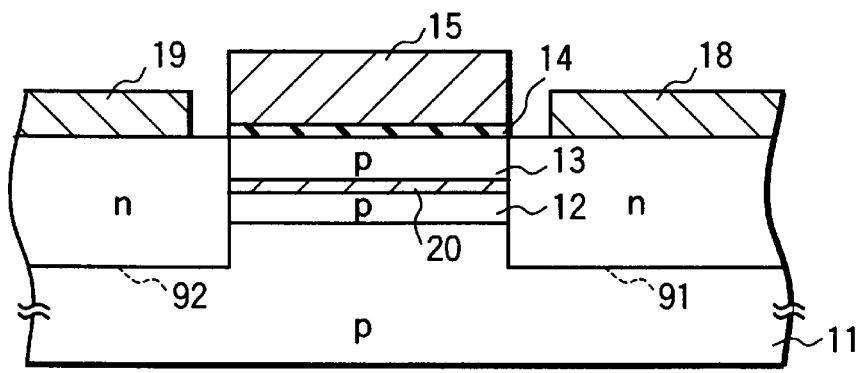
FIG. 5 is a cross-sectional view showing a device structure of an MOS transistor according to a modification of the second embodiment of the present invention.

The second embodiment can be modified as shown in FIG. 5. In the modification, n-type source and drain buried layers 91 and 92 are formed in place of the layers 16 and 17. With this structure, the same effect as in the first embodiment can be obtained. In this case, ten combinations of materials of the layers 11, 12 and 13, as indicated in Table 3, are possible.

TABLE 3

| Layer 11 | 4H—SiC | 6H—SiC | 4H—SiC | 4H—SiC | 6H—SiC |
|---|---|---|---|---|---|
| Layer 12 | Si | Si | Si | Si | Si |
| Layer 13 | 4H—SiC | 6H—SiC | GaN | Diamond | GaN |
| Layer 11 | 6H—SiC | 3C—SiC | 3C—SiC | 3C—SiC | 3C—SiC |
| Layer 12 | Si | Si | Si | 4H—SiC | 4H—SiC |
| Layer 13 | Diamond | GaN | Diamond | GaN | Diamond |

(Third Embodiment)

Figure 6:
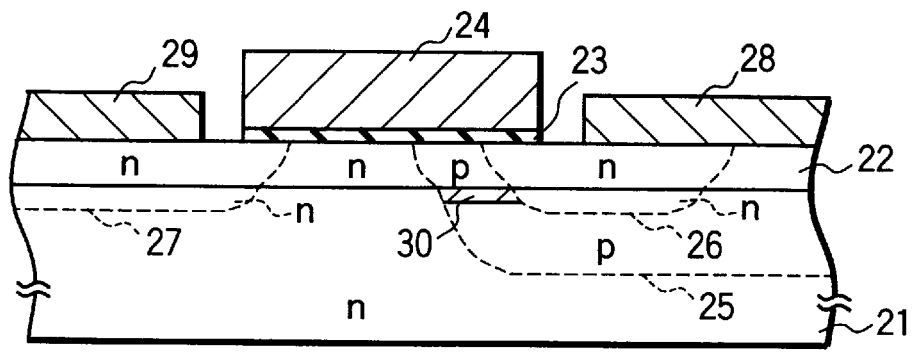
FIG. 6 is a cross-sectional view showing a device structure of an MOS transistor according to a third embodiment of the present invention.

FIG. 6 is a cross-sectional view showing a device structure of an MOS transistor according to a third embodiment of the present invention. While the n-channel MOS transistor of the first embodiment is formed of the first and second p-type SiC layers 1 and 2, an n-channel MOS transistor of the third embodiment is formed by double-diffusion of first and second n-type semiconductor layers 21 and 22.

A gate insulating film 23 is provided above a first n-type semiconductor layer 21 via a second n-type semiconductor layer 22, wherein an energy difference between the bottom of a conduction band and a vacuum level is smaller than that in the n-type semiconductor layer 21. In this case, the material of the first n-type semiconductor layer 21 may be, for example, 6H—SiC and the material of the second n-type semiconductor layer 22 may be, for example, 4H—SiC.

Figure 7:
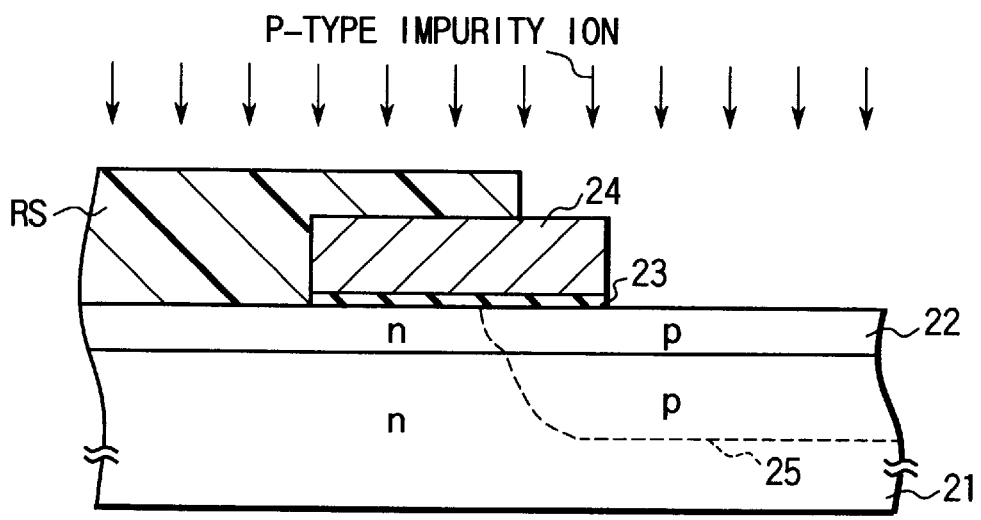
FIG. 7 is a cross-sectional view showing a method for forming a p-type diffusion layer of the MOS transistor shown in FIG. 6.

A gate electrode 24 is formed on the gate insulating film 23. As shown in FIG. 7, a p-type diffusion layer 25 is formed in the n-type semiconductor layers 21 and 22 through a step of implanting p-type impurity ions using the gate electrode 24 and a resist RS as a mask and a subsequent step of annealing.

An n-type source diffusion layer 26 having a high impurity concentration is formed in a surface portion of the p-type diffusion layer 25 by self-alignment to the gate electrode 24 through a step of implanting n-type impurity ions and a subsequent step of annealing. At the same time, an n-type drain diffusion layer 27 having a high impurity concentration is formed to the left side (in the drawing) of the gate electrode 24 by self-alignment to the gate electrode 24. Source and drain electrodes 28 and 29 are in contact with the n-type source and drain diffusion layers 26 and 27 with low contact resistance.

According to the third embodiment of the present invention, since the n-type SiC layer 22 has a smaller energy difference between the bottom of the conduction band and the vacuum level than that in the n-type semiconductor layer 21, an n-channel 30 is formed on the n-type SiC layer 21 within the p-type diffusion layer 25 near the interface between the n-type SiC layer 21 and the n-type SiC layer 22, and not near the interface between the gate insulating film 23 and the p-type diffusion layer 25. Therefore, even if the substrate is made of SiC, in which a number of dangling bonds are formed on the MOS interface, the reduction in carrier mobility can be sufficiently suppressed.

Thus, according to the third embodiment of the present invention, the reduction in carrier mobility due to dangling bonds is more sufficiently suppressed as compared to the conventional MOS transistor having a gate insulating film directly provided on an SiC film. Therefore, an MOS transistor of a high channel mobility can be realized.

In the following, an explanation will be provided for a case in which the second n-type semiconductor layer 22 is made of a material having a higher diffusion coefficient for a p-type impurity as compared to the first n-type semiconductor layer 21.

In the case of using a material of a high diffusion coefficient, a p-type impurity is not only diffused vertically into the first n-type semiconductor layer 21 via the second n-type semiconductor layer 22, a p-type impurity introduced into the second n-type semiconductor layer 22 is also diffused horizontally and further diffused vertically into the first n-type semiconductor layer 21 from the portion where the ions are injected.

Thus, even if the diffusion coefficient of the first n-type semiconductor layer 21 is small, the p-type diffusion layer 25 can be formed easily, and accordingly the double diffusion structure can be formed easily. A very thin second n-type semiconductor layer suffices for this purpose. Such a second n-type semiconductor layer can be oxidized and removed by etching, when it becomes unnecessary.

Since SiC is used as a material of the substrate, this embodiment realizes a thinner MOS transistor having a higher withstand voltage, as compared to a case in which Si is used.

Further, when the device structure of this embodiment is used as a surface gate structure of a vertical semiconductor device, a material of the first n-type semiconductor layer 21 is selected, depending whether the channel resistance or the drift resistance is a greater component of the ON resistance.

More specifically, if the ON resistance is mainly composed of the channel resistance, a material having a high horizontal electron mobility, e.g., 6H—SiC, can be used to lower the channel resistance. Contrarily, if the ON resistance is mainly composed of the drift resistance, a material having a high vertical electron mobility, e.g., 4H—SiC, can be used to lower the drift resistance.

In this manner, the ON resistance can effectively be reduced by selecting a suitable material to lower the drift resistance. In general, the ON resistance is mainly composed of the channel resistance in a device of a low withstand voltage, and the drift resistance in a device of a high withstand voltage.

(Fourth Embodiment)

Figure 8:
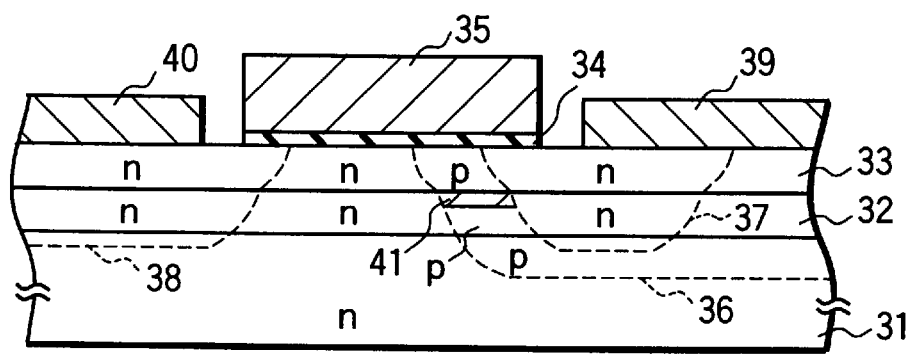
FIG. 8 is a cross-sectional view showing a device structure of an MOS transistor according to a fourth embodiment of the present invention.

FIG. 8 is a cross-sectional view showing a device structure of an MOS transistor according to a fourth embodiment of the present invention. While the n-channel MOS transistor of the second embodiment is formed of the first p-type SiC layer 11, the p-type Si layer 12 and the second p-type SiC layer 13, an n-channel MOS transistor of the fourth embodiment is formed by double-diffusion of a first n-type SiC layer 31, a second n-type SiC layer 32 and a third n-type SiC layer 33.

For example, on a first n-type 4H—SiC layer 31, there is provided a second n-type 6H—SiC layer 32, wherein the electron mobility in the horizontal direction (the main current flowing direction) is higher than that in the layer 31. A gate insulating film 34 is provided above the second n-type 6H—SiC layer 32 via a third n-type 4H—SiC layer 33, wherein the energy difference between the bottom of the conduction band and the vacuum level is smaller than that in the layer 32.

A gate electrode 35 is formed on the gate insulating film 34. As in the third embodiment, a p-type diffusion layer 36 is formed in the n-type SiC layers 31, 32 and 33 through a step of implanting p-type impurity ions using the gate electrode 35 and a resist (not shown) as a mask and a subsequent step of annealing.

An n-type source diffusion layer 37 having a high impurity concentration is formed in a surface portion of the p-type diffusion layer 36 by self-alignment, through a step of implanting n-type impurity ions using the gate electrode 35 as a mask and a subsequent step of annealing. At the same time, an n-type drain diffusion layer 38 having a high impurity concentration is formed to the left side (in the drawing) of the gate electrode 35 by self-alignment to the gate electrode 35. Source and drain electrodes 39 and 40 are in contact with the n-type source and drain diffusion layers 37 and 38 with a low resistance.

According to this embodiment, in a channel region defined by the gate electrode 35, the n-type 6H—SiC layer 32 wherein the carrier mobility in the horizontal direction (the main current flowing direction) is higher than that in the n-type 4H—SiC layer 31 is provided, and the gate insulating film 34 is provided above the n-type 6H—SiC layer 32 via the n-type 4H—SiC layer 33, wherein an energy difference between the bottom of the conduction band and the vacuum level is smaller than that in the n-type 6H—SiC layer 32.

With this structure, when a voltage exceeding the threshold voltage is applied to the gate electrode 35, an n-channel 41 is formed on the n-type 6H—SiC layer 32 within the p-type diffusion layer 36, near the interface between the n-type 6H—SiC layer 32 and the n-type 4H—SiC layer 33, and not near the interface (MOS interface) between the gate insulating film 34 and the p-type diffusion layer 36. Therefore, even if the substrate is made of SiC, in which a number of dangling bonds are formed on the surface, the reduction in carrier mobility can be sufficiently suppressed.

As described above, the fourth embodiment of the present invention realizes an MOS transistor of a high channel mobility, wherein the reduction in carrier mobility due to surface roughness and dangling bonds is more sufficiently suppressed as compared to the conventional MOS transistor having a gate insulating film directly provided on an SiC film.

Further, according to this embodiment, since the n-channel is formed in the 6H—SiC layer 32 having a higher carrier mobility in the horizontal direction (main current direction) than that in the 4H—SiC layer 33, the carrier mobility can be higher than that in the third embodiment wherein the n-channel is formed in the 4H—SiC layer.

In the following, an explanation will be provided for a case in which the second n-type semiconductor layer 32 is made of a material having a higher diffusion coefficient for a p-type impurity as compared to the first n-type semiconductor layer 31.

In the case of using the second n-type semiconductor layer 32, a p-type impurity is not only diffused vertically into the first n-type semiconductor layer 31 via the second n-type semiconductor layer 32, a p-type impurity introduced into the second n-type semiconductor layer 32 is also diffused horizontally and further diffused vertically into the first n-type semiconductor layer 31 from the portion where the ions are injected.

Thus, even if the diffusion coefficient of the first n-type semiconductor layer 31 is small, the p-type diffusion layer 36 can be formed easily, and accordingly the double diffusion structure can be formed easily.

When the device structure of this embodiment is used as a surface gate structure of a vertical semiconductor device, a material, such as 4H—SiC, which has a high electron mobility in the vertical direction (parallel to the c-axis) can be used as the material of the first n-type semiconductor layer, a material, such as 6H—SiC, which has a high electron mobility in the horizontal direction (perpendicular to the c-axis) can be used as the material of the second n-type semiconductor layer, and 4H—SiC can be used as the third n-type semiconductor layer. In this case, it is possible to realize a reliable device in which the lattice constants in the second and third semiconductor layers matches well to each other.

When the device of this embodiment is used as the surface gate structure of a vertical semiconductor device, since SiC is used as a material of the substrate, this embodiment realizes a thinner MOS transistor having a higher withstand voltage, as compared to a case in which Si is used.

(Fifth Embodiment)

Figure 9:
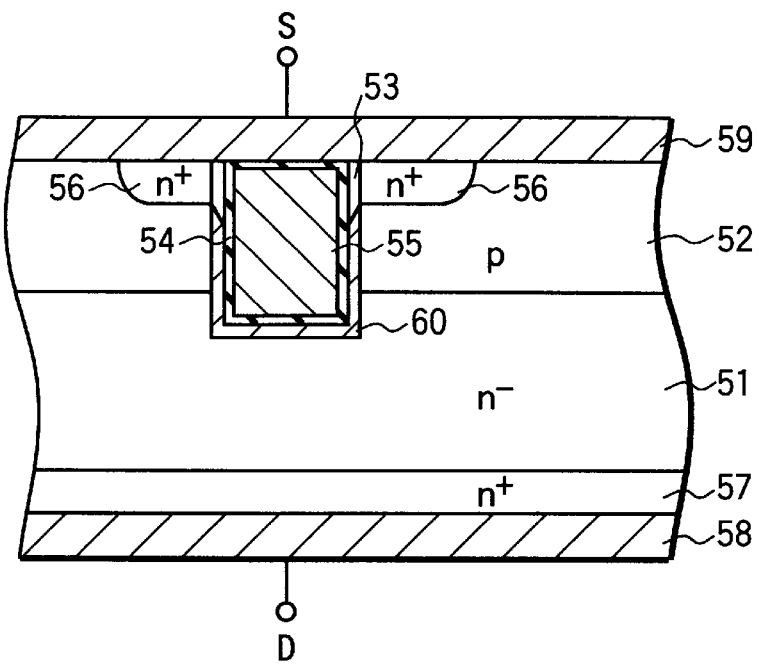
FIG. 9 is a cross-sectional view showing a device structure of an MOS transistor according to a fifth embodiment of the present invention.

FIG. 9 is a cross-sectional view showing a device structure of an MOS transistor according to a fifth embodiment of the present invention. In FIG. 9, a reference numeral 51 denotes an n-type SiC layer of a high resistance, on the main surface of which a p-type SiC layer 52 is formed. A trench is formed extending across the p-type SiC layer 52 and to a portion of the n-type SiC layer 51. On the bottom and side walls of the trench, a p-type Si layer 53 is formed, in which the carrier mobility is higher than that in the n-type SiC layer 51 and the p-type SiC layer 52. The thickness of the p-type Si layer 53 is substantially the same as that of an inverted layer which is formed when the device is on.

A gate electrode 55 is buried in the trench on a gate insulating film 54, which is formed on the layer 53. An n-type source layer 56 of a high impurity concentration is formed in a surface portion of the p-type SiC layer 52 around the trench.

An n-type drain layer 57 of a high impurity concentration is formed on the rear surface of the n-type SiC layer 51. A drain electrode 58 is formed on that surface of the device on which the n-type drain layer 57 is formed. A source electrode 59 is formed on that surface of the device on which the n-type source layer 56 is formed.

According to this embodiment, in a channel region defined by the gate electrode 55, the p-type Si layer 53, wherein the carrier mobility is higher and dangling bonds are less than those in the n-type SiC layer 51 and the p-type SiC layer 52, is formed on these layers 51 and 52, and the gate insulating film 54 is formed on the p-type Si layer 53.

With this structure, when a voltage exceeding the threshold voltage is applied to the gate electrode 55, an n-channel 60 is formed in the p-type Si layer 53. Since the p-type Si layer 53 has a higher carrier mobility and less dangling bonds than those of the n-type SiC layer 51 and the p-type SiC layer 52, the reduction in carrier mobility can be sufficiently suppressed.

As described above, the fifth embodiment of the present invention realizes an MOS transistor of a high channel mobility, wherein the reduction in carrier mobility due to surface roughness and dangling bonds is more sufficiently suppressed as compared to the conventional MOS transistor having a gate insulating film directly provided on an SiC film.

Further, according to this embodiment, since SiC is used as a material of the substrate, it is possible to realize an MOS transistor having a thinner base layer (the n-type SiC layer 51) and a higher withstand voltage, as compared to a case in which Si is used.

Furthermore, when the device is off, relaxation of the electric field applied to the gate insulating film 54 can occur by the p-type Si layer 53 on the bottom of the trench.

Figure 10:
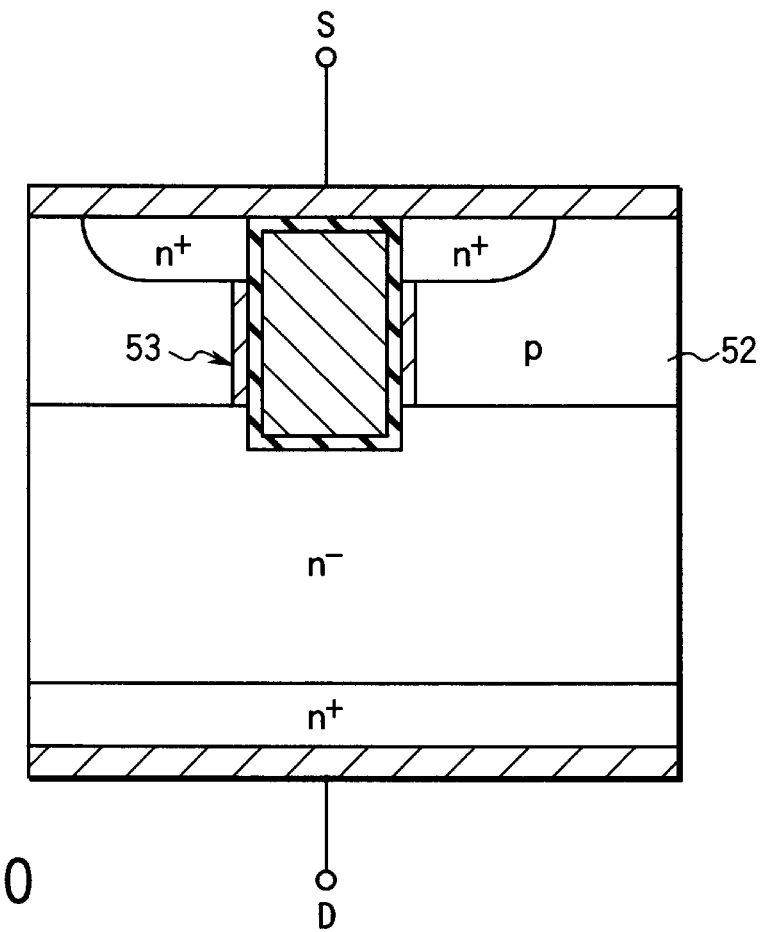
FIG. 10 is a cross-sectional view showing a device structure of an MOS transistor according to a modification of the fifth embodiment of the present invention.

This embodiment can be modified as shown in FIG. 10. In the modification, a p-type Si layer 53 is formed only on the side wall of the trench within the p-type SiC layer 52. In this case, the mobility in the layer 53 is greater than that in the layer 52. With this structure, the same effect as described above can be obtained.

(Sixth Embodiment)

Figure 11:
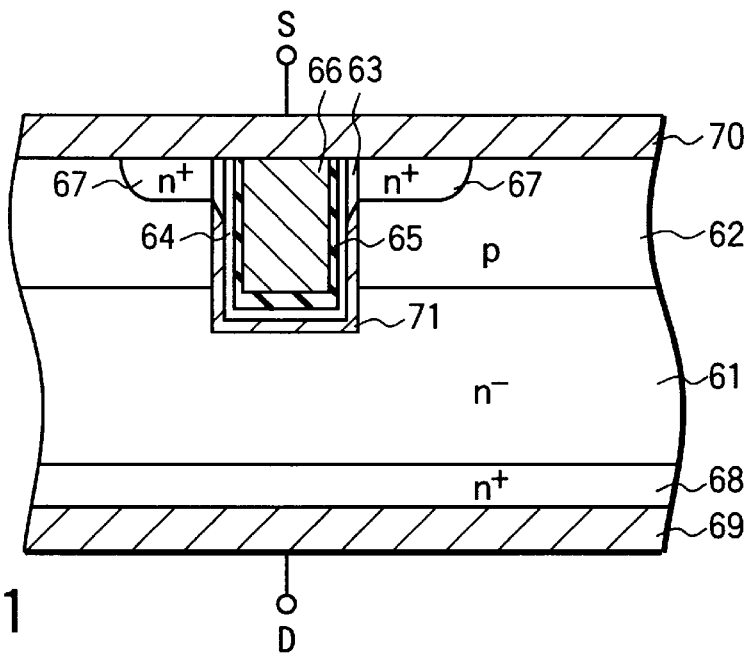
FIG. 11 is a cross-sectional view showing a device structure of an MOS transistor according to a sixth embodiment of the present invention.

FIG. 11 is a cross-sectional view showing a device structure of an MOS transistor according to a sixth embodiment of the present invention. In FIG. 11, a reference numeral 61 denotes an n-type SiC layer (base) of a high resistance, on the main surface of which a p-type SiC layer 62 is formed. A trench is formed extending across the p-type SiC layer 62 and to a portion of the n-type SiC layer 61.

On the bottom and side walls of the trench, a p-type Si layer 63 is formed, in which the carrier mobility is higher than that in the n-type SiC layer 61 and the p-type SiC layer 62. On the p-type Si layer 63, a p-type SiC layer 64 of 3C—SiC (a p-type semiconductor) is formed, in which the energy difference between the bottom of the conduction band and the vacuum level is smaller than that in the p-type SiC layer 63. The thickness of the p-type Si layer 63 is substantially the same as that of an inverted layer which is formed when the device is on.

A gate electrode 66 is buried in the trench on a gate insulating film 65, which is formed on the p-type Si layer 63 and the p-type SiC layer 64 in the trench. An n-type source layer 67 of a high impurity concentration is formed in a surface portion of the p-type SiC layer 62 around the trench.

An n-type drain layer 68 of a high impurity concentration is formed on the rear surface of the n-type SiC layer 61. A drain electrode 69 is formed on that surface of the device on which the n-type drain layer 68 is formed. A source electrode 70 is formed on that surface of the device on which the n-type source layer 67 is formed.

According to this embodiment, in a channel region defined by the gate electrode 66, the p-type Si layer 63, wherein the carrier mobility is higher and dangling bonds are less than those in the n-type SiC layer 61 and the p-type SiC layer 62, is formed on these layers 61 and 62 (the bottom and side walls of the trench). On the p-type Si layer 63, a gate insulating film 65 is provided via a p-type SiC layer 64, wherein an energy difference between the bottom of the conduction band and the vacuum level is smaller than that in the layer 63.

With this structure, when a voltage exceeding the threshold voltage is applied to the gate electrode 66, an n-channel 71 is formed in the p-type Si layer 63 near the interface between the p-type SiC layer 64 and the p-type Si layer 63, and not near the interface (MOS interface) between the gate insulating film 65 and the p-type SiC layer 64. Therefore, even if the substrate is made of SiC in which great roughness and a number of dangling bonds are generated on the surface thereof, the reduction in carrier mobility can be sufficiently suppressed.

As described above, the sixth embodiment of the present invention can realize an MOS transistor of a high channel mobility, wherein the reduction in carrier mobility due to surface roughness and dangling bonds is more sufficiently suppressed as compared to the conventional MOS transistor having a gate insulating film directly provided on an SiC film.

In this embodiment, it is preferable that the layer 63 of all the semiconductor layers formed on the trench side wall have a difference in energy between the bottom of the conduction band and the vacuum level, smaller than or substantially the same as that of the SiC layer 61, so that the carriers in the layer 63 can flow out into the layer 61.

Further, according to this embodiment, since SiC is used as a material of the substrate, this embodiment realizes a thinner MOS transistor having a higher withstand voltage, as compared to a case in which Si is used.

Furthermore, when the device is off, relaxation of the electrical field applied to the gate insulating film 65 can occur by the p-type Si layer 63 on the bottom of the trench.

Figure 12:
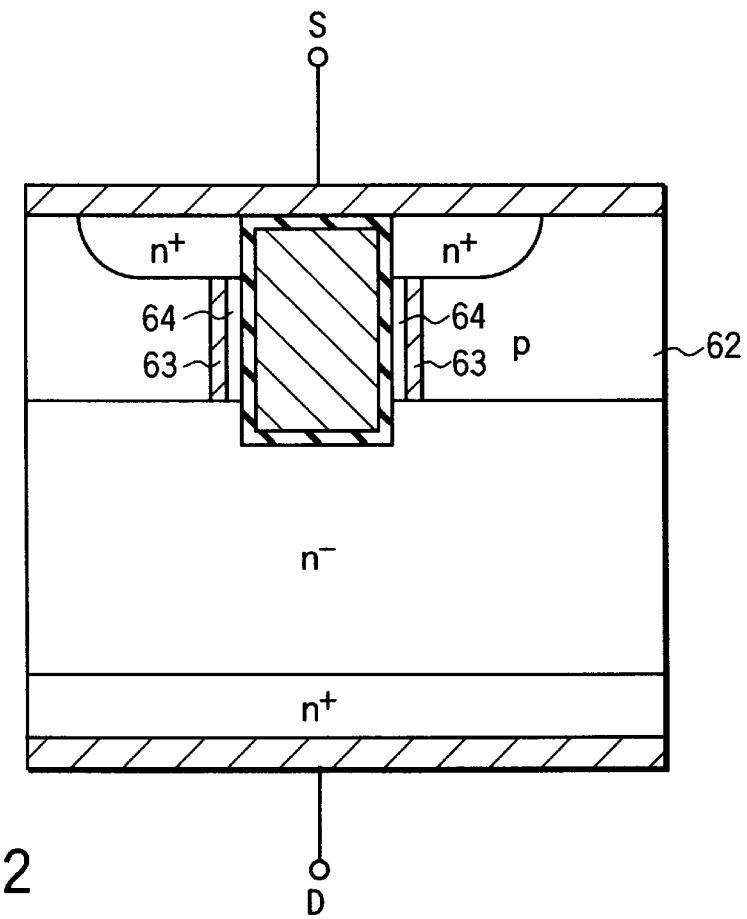
FIG. 12 is a cross-sectional view showing a device structure of an MOS transistor according to a modification of the sixth embodiment of the present invention.

This embodiment can be modified as shown in FIG. 12. In the modification, the p-type Si layer 63 and the p-type SiC layer 64 are formed only on the side wall of the trench within the p-type SiC layer 62. With this structure, the same effect as described above can be obtained.

In the sixth embodiment, combinations of materials of the layers 62, 63 and 64, as indicated in Table 4, are possible.

TABLE 4

| Layer 62 | 4H—SiC | 6H—SiC | 4H—SiC | 4H—SiC | 6H—SiC |
| --- | --- | --- | --- | --- | --- |
| Layer 63 | Si | Si | Si | Si | Si |
| Layer 64 | 4H—SiC | 6H—SiC | GaN | Diamond | GaN |

| Layer 62 | 6H—SiC | 3C—SiC | 3C—SiC | 3C—SiC | 3C—SiC |
| --- | --- | --- | --- | --- | --- |
| Layer 63 | Si | Si | Si | 4H—SiC | 4H—SiC |
| Layer 64 | Diamond | GaN | Diamond | GaN | Diamond |

(Seventh Embodiment)

Figure 13:
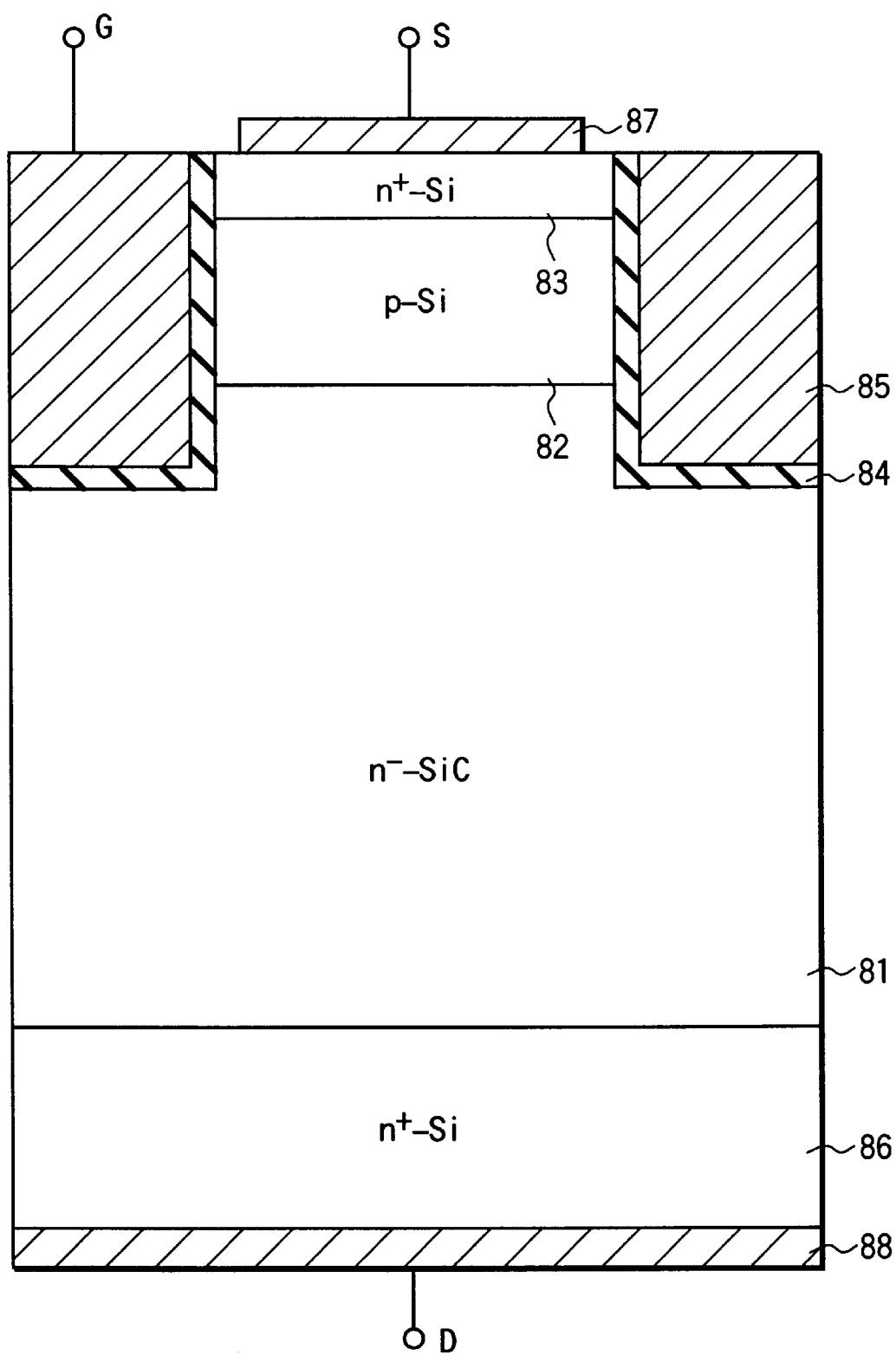
FIG. 13 is a cross-sectional view showing a device structure of an MOS transistor according to a seventh embodiment of the present invention.

FIG. 13 is a cross-sectional view showing a device structure of an MOS transistor according to a seventh embodiment of the present invention. In FIG. 13, a reference numeral 81 denotes an n-type SiC layer (base) of a high resistance, on the main surface of which a p-type Si layer 82 and an n-type source layer 83 of a high impurity concentration are successively formed in this order. The n-type source layer 83, the p-type Si layer 82 and an upper portion of the n-type SiC layer 81 are processed to form an island structure.

A gate electrode 85 is provided around the island structure via a gate insulating film 84. An n-type drain layer 86 of SiC of a high impurity concentration is formed on the rear surface of the n-type SiC layer 81. A source electrode 87 and a drain electrode 88 are formed respectively on the n-type source layer 83 and the n-type drain layer 86.

Unlike the conventional structure wherein a p-type SiC layer forms a channel region, according to this embodiment, since the p-type Si layer 82 forms a channel region, the reduction in carrier mobility due to roughness scattering and a number of dangling bonds formed in the MOS interface can be suppressed.

If 3C—SiC is used as SiC, lattice matching between the n-type SiC layer 81 and the p-type Si layer 82 and between the p-type Si layer 82 and the n-type source layer 83 can be achieved easily. Alternatively, 4H—SiC or 6H—SiC can be used instead of 3C—SiC. In this case also, the same effect as that obtained in the case of 3C—SiC.

Although the case of an MOS transistor has been described, the same effect is obtained in an IGBT in which the n-type drain layer 86 of the MOS transistor is replaced by a p-type drain layer.

FIGS. 14A to 14F are cross-sectional views showing, in sequence, steps of a process for forming the source side of the MOS transistor of the above embodiment. The drain side of the MOS transistor is formed in the conventional manner.

Figure 14A:
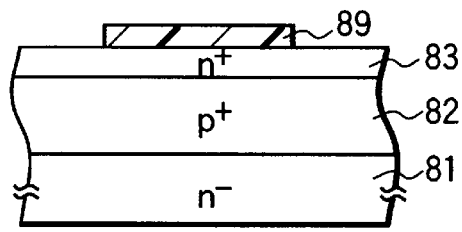
FIGS. 14A to 14F are cross-sectional views showing steps of forming the MOS transistor shown in FIG. 13.

First, as shown in FIG. 14A, the p-type Si layer 82 and the n-type source layer 83 are formed in this order on the n-type SiC layer 81. Thereafter, a resist pattern 89 is formed on the n-type source layer 83.

Figure 14B:
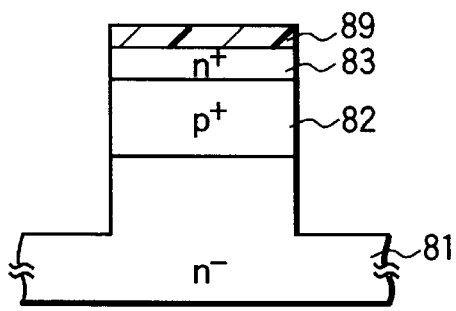

Then, as shown in FIG. 14B, the n-type source layer 83, the p-type Si layer 82 and the n-type SiC layer 81 are processed to form an island structure by anisotropic etching, such as RIE, using the resist pattern 89 as a mask.

Figure 14E:
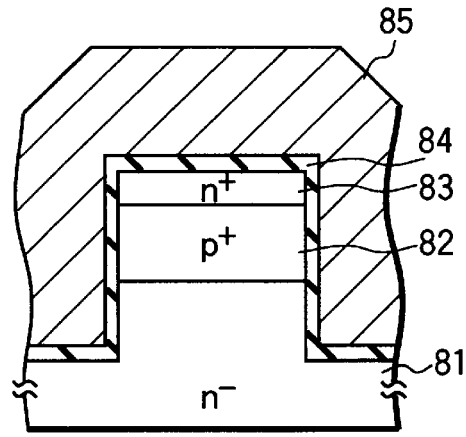
Figure 14C:
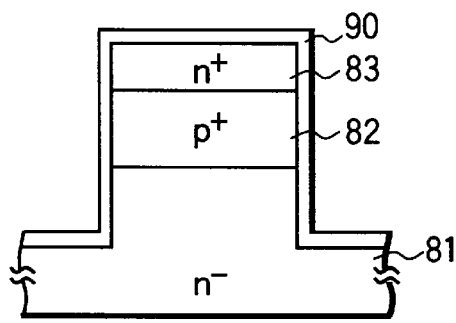

Subsequently, as shown in FIG. 14C, an Si film 90 serving as a gate insulating film is formed on the overall surface.

Figure 14F:
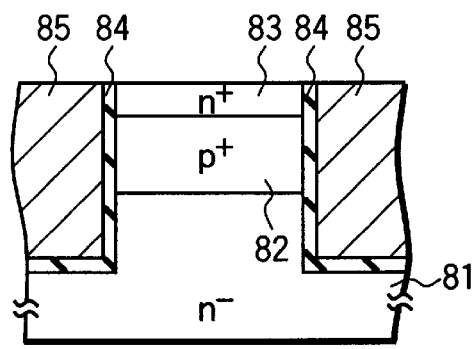
Figure 14D:
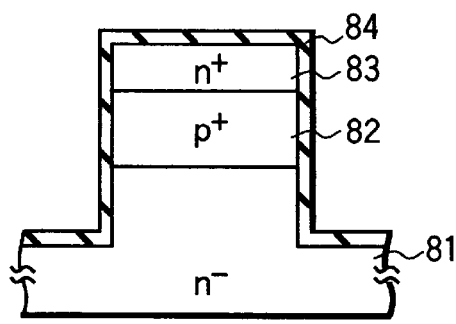

Thereafter, as shown in FIG. 14D, the Si film 90 is oxidized, thereby forming a gate insulating film 84.

Then, as shown in FIG. 14E, a gate electrode 85 is formed on the overall surface of the device to bury the projections on the surface.

Finally, as shown in FIG. 14F, unnecessary portions of the gate electrode 85 and the gate insulating film 84 are removed.

In this embodiment, the Si film 90 is oxidized to form the gate insulating film 84 in the step shown in FIG. 14C; however, the gate insulating film 84 may be directly formed on the device surface. Such an insulating film may be made of AlN.

(Eighth Embodiment)

Figure 15:
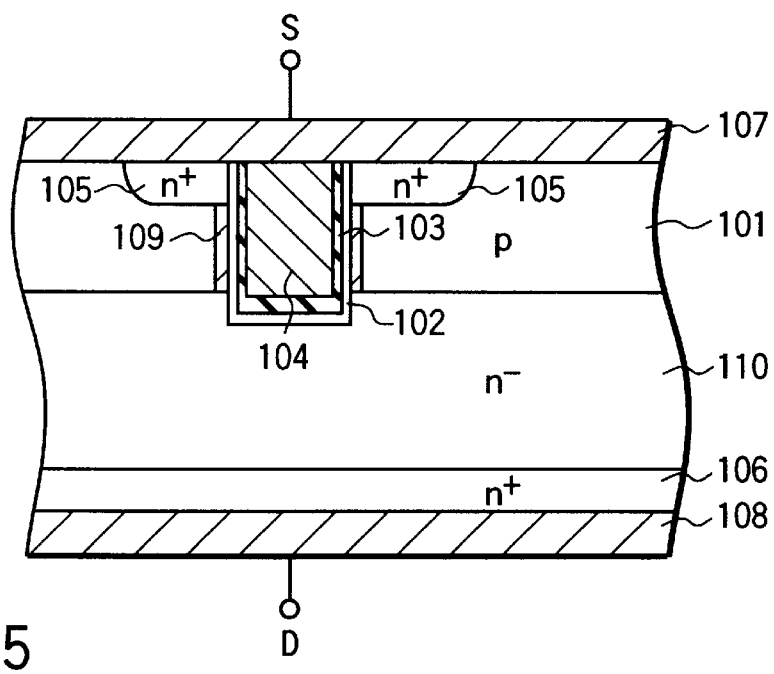
FIG. 15 is a cross-sectional view showing a device structure of an MOS transistor according to an eighth embodiment of the present invention.

FIG. 15 is a cross-sectional view showing a device structure of an MOS transistor according to an eighth embodiment of the present invention. This embodiment is the same as the first embodiment except for the trench structure. In FIG. 15, a reference numeral 110 (corresponding to the layer 1 in FIG. 3) denotes an n-type SiC layer of a high resistance, on the main surface of which a p-type SiC layer 101 made of 6H—SiC is formed. A trench is formed extending across the p-type SiC layer 101 and to a portion of the n-type SiC layer 110. On the bottom and side walls of the trench, a p-type Si layer 102 (corresponding to the layer 2 in FIG. 3) made of 4H—SiC is formed.

A gate insulating film 103 is formed on the p-type Si layer 102 in the trench, and a gate electrode 104 is buried in the trench on the gate insulating film 103. An n-type source layer 105 (corresponding to the layer 5 in FIG. 3) of a high impurity concentration is formed in a surface portion of the p-type SiC layer 101 around the trench.

An n-type drain layer 106 (corresponding to the layer 6 in FIG. 3) of a high impurity concentration is formed on the rear surface of the n-type SiC layer 110. A drain electrode 108 is formed on that surface of the device on which the n-type drain layer 106 is formed. A source electrode 107 is formed on that surface of the device on which the n-type source layer 105 is formed.

In this embodiment, the gate insulating film 103 is connected to the p-type Si layer 101 via the p-type Si layer 102. In other words, in a channel forming region, the gate insulating film is provided above the p-type SiC layer 101 via the p-type Si layer 102, wherein an energy difference between the bottom of the conduction band and the vacuum level is smaller than that in the layer 101.

With this structure, when a voltage exceeding the threshold voltage is applied to the gate electrode 104, an n-channel 109 is formed on the p-type SiC layer 101 near the interface between the p-type SiC layer 101 and the p-type Si layer 102, and not near the interface between the gate insulating film 103 and the p-type Si layer 102. As the result, the same effect as that of the first embodiment can be obtained.

Figure 16:
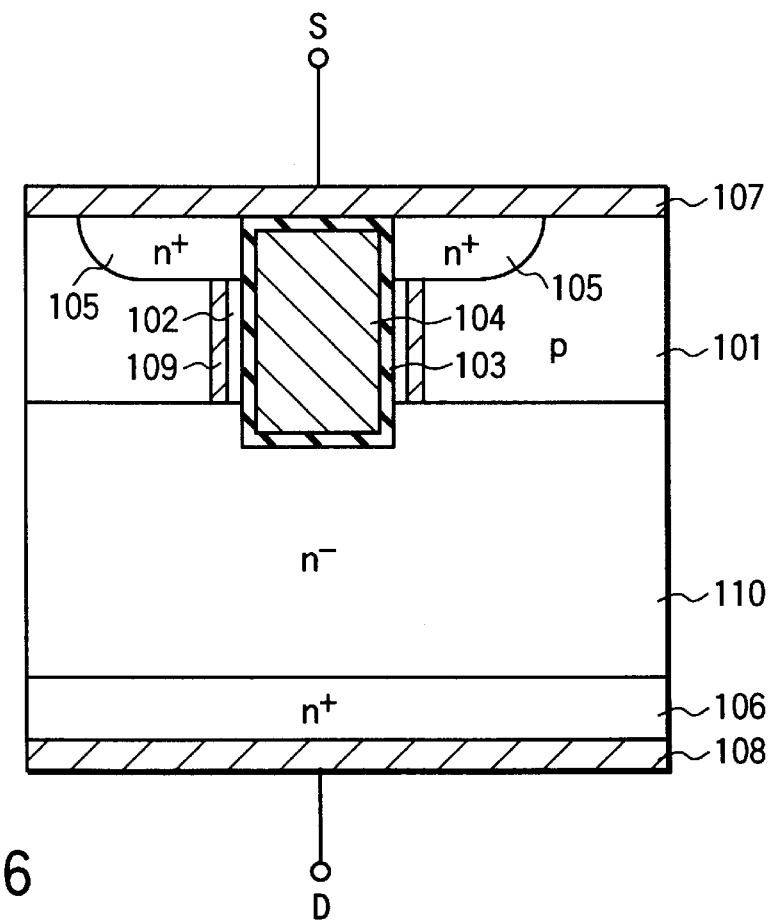
FIG. 16 is a cross-sectional view showing a device structure of an MOS transistor according to a modification of the eighth embodiment of the present invention.

This embodiment can be modified as shown in FIG. 16. In the modification, a p-type Si layer 102 is formed only on the side wall of the trench within the p-type SiC layer 101. With this structure also, the same effect as that of the first embodiment can be obtained.

Combinations of materials of the p-type SiC layer 101 and the p-type Si layer 102 may be as those indicated in Table 1, in which the layers 1 and 2 should read as the layers 101 and 102.

The present invention is not limited to the above embodiments. For example, although the case of an MOS transistor has been mainly described, the present invention can be applied to other insulating gate type semiconductor device, such as IGBT (IEGT).

According to the first to fifth aspects of the present invention as have been described above, an insulating gate structure, wherein a gate electrode is provided on semiconductor layers via a gate insulating film, is employed. The semiconductor layers may be formed of a first semiconductor layer and a second semiconductor layer formed thereon, in which the energy difference between the bottom of the conductive band and the vacuum level is smaller or the carrier mobility is greater than that in the first semiconductor layer. Alternatively, the semiconductor layers may be formed of a first semiconductor layer, a second semiconductor layer formed thereon, in which the carrier mobility is greater than that of the first semiconductor layer, and a third semiconductor layer formed thereon, in which the energy difference between the bottom of the conductive band and the vacuum level is smaller than that in the second semiconductor layer. With the insulating gate structure, even if the first semiconductor layer is made of a material, such as SiC, in which great roughness or a number of dangling bonds are formed on the surface, it is possible to realize a semiconductor device of insulating gate type, wherein reduction of the channel mobility can be prevented.

A sixth aspect of the present invention, in relation to a semiconductor device formed on an epitaxial layer, will now be described.

Figure 17:
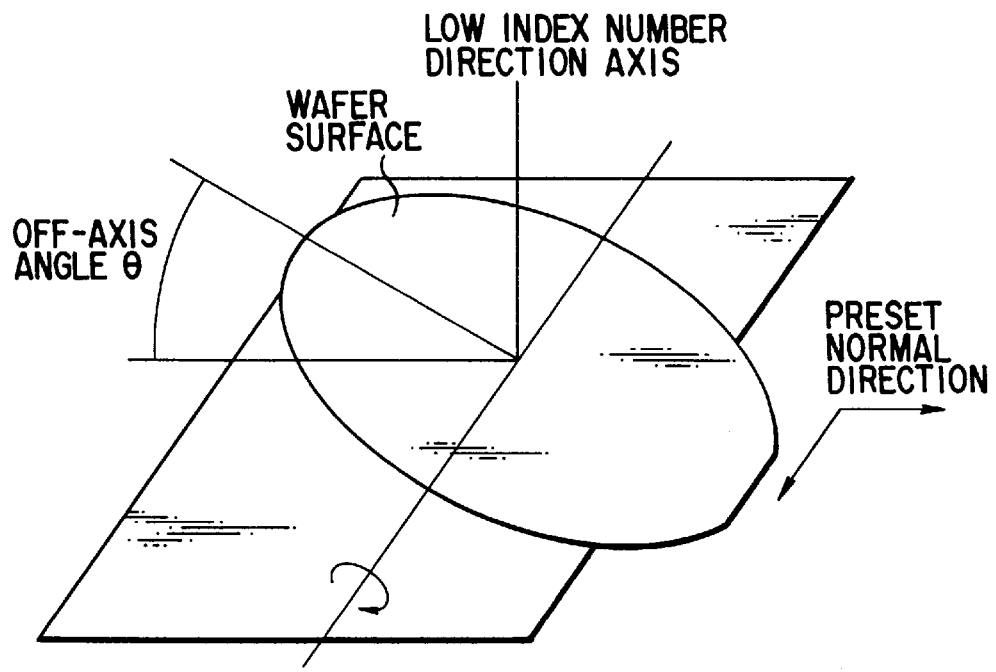
FIG. 17 is a diagram for explaining an off-axis angle of a substrate.

In general, to grow an epitaxial layer, the semiconductor substrate is polished so that the substrate is misoriented θ degree in a preset direction normal to a low index number direction axis, as shown in FIG. 17, and an epitaxial layer is formed on the polished off-axis surface of the substrate. The substrate thus obtained is hereinafter referred to as an off-axis substrate.

Figure 18:
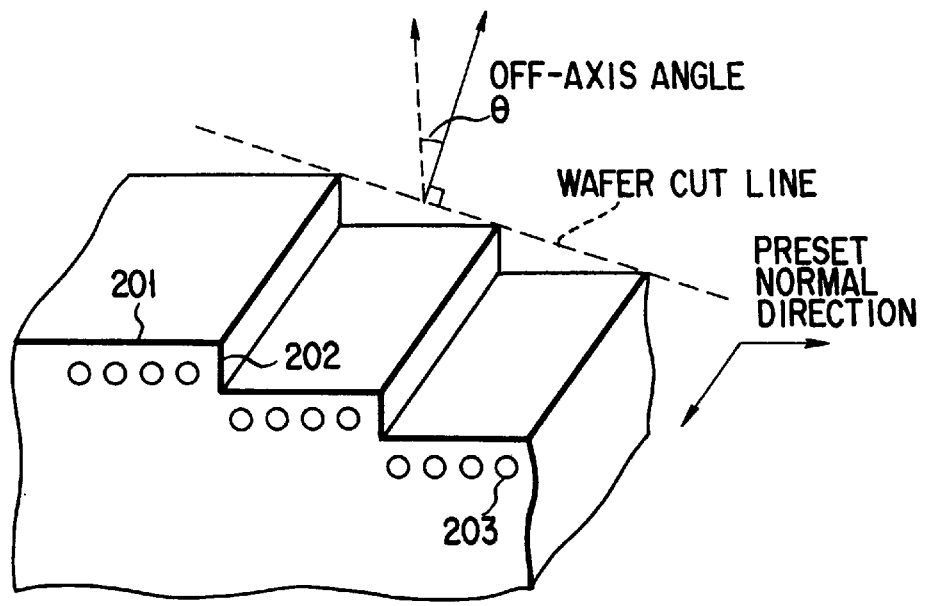
FIG. 18 is a diagram for explaining a stepped surface formed when the substrate is polished to form an angle with the low index number direction axis.

This method is employed because a monocrystalline layer including few crystal defects can be formed by epitaxially growing monocrystal on a stepped surface of the substrate, as shown in FIG. 18. Referring to FIG. 18, a terrace 201 and a vertical surface 202 are formed on the surface of an epitaxial layer. Surface atoms 203 are arranged substantially at regular intervals. The method is particularly effective in a case of monocrystal, such as SiC, wherein the lattice structure is perodic.

Figure 19A:
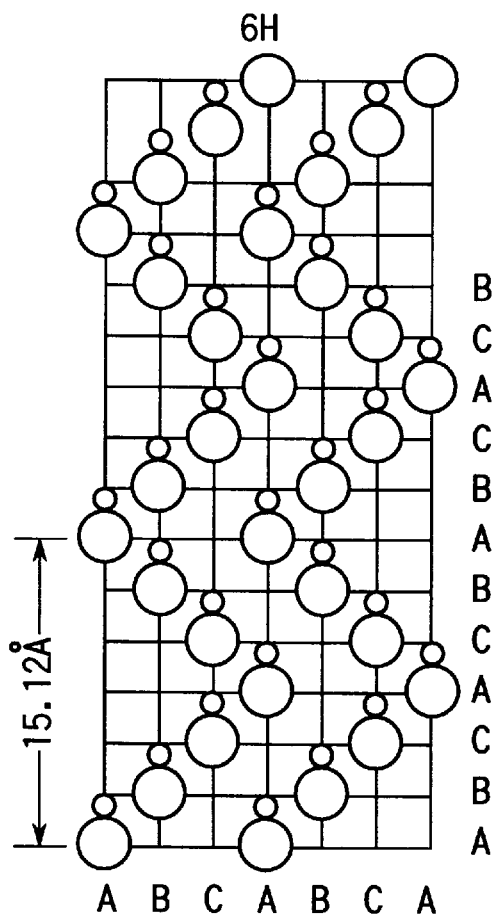
Figure 19B:
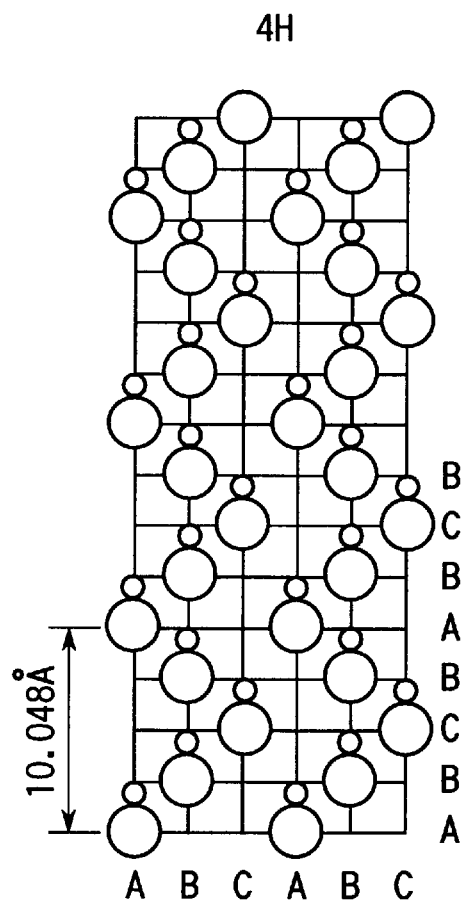

FIGS. 19A and 19B show typical SiC crystal structures of hexagonal polytype, 6H—SiC and 4H—SiC, respectively. The numeral 6 or 4 represents the cycle period in the direction of c axis, and the letter H represents that the crystal is of hexagonal polytype. If the three settling positions in the closest packing structure are represented as A, B and C (assuming that a pair of Si and is one unit), the stacking sequences of the polytypes are expressed as 6H: ABCACB . . . and 4H: ABCB . . .

As regards the hexagonal SiC having the complicated periodical structure, the group of Matsunami et al. in Kyoto University discovered the following matter: a very smooth monocrystalline layer can be obtained at a relatively low temperature by a method in which the hexagonal SiC {0001} substrate is polished to have a tilt towards the <11–20> direction and monocrystal is epitaxially grown on the plane. This method is called step-controlled epitaxy.

Figure 20:
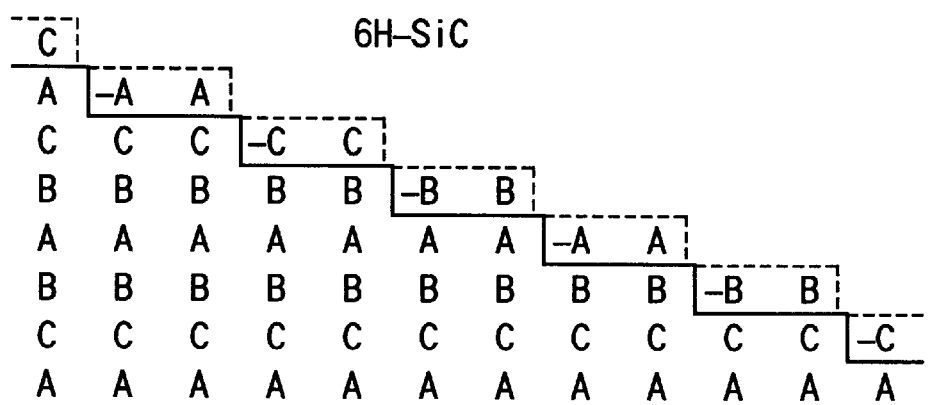
FIG. 20 is a diagram for explaining step flow epitaxy of SiC.

FIG. 20 is a schematic drawing of step-controlled epitaxy on an off-axis substrate of 6H—SiC. As shown in FIG. 20, since the lattice structure is exposed on the steps (corresponding to the vertical surface 202 in FIG. 18), monocrystal is grown in succession to the lattice structure, so that monocrystalline layers having the same lattice structure can be obtained. In other words, it is very difficult to grow monocrystalline layers having the same lattice structure, unless the substrate is polished at the predetermined angle.

On the surface of the epitaxial layer thus grown, steps are also formed reflecting the steps on the surface of the substrate. On the off-axis hexagonal SiC substrate off the (0001) plane as described above, there are a number of steps having a height of three molecular layers (about 0.8 nm) in 6H structure and a height of four molecular layers (about 1 nm) in 4H structure, due to the stacking structure in which the stack direction is bent every three or two molecular layers (see FIGS. 19A and 19B), assuming that a pair of Si and C is one molecular layer. On the off-axis substrate off the (000-1) C plane, there are a number of steps having a height of one molecular layer (about 0.25 nm). It is considered that the steps are formed due to a difference in surface energy between the {000n} planes.

However, there is no conventional art for forming a device region in which the direction of the controlling current coincides with a specific direction in the vertical surface of the step. Therefore, if a vertical surface of the stepped structure is included in a current path of the device, electrons or holes are scattered at the vertical surface, resulting in a problem of high resistance in the divece.

Figure 21:
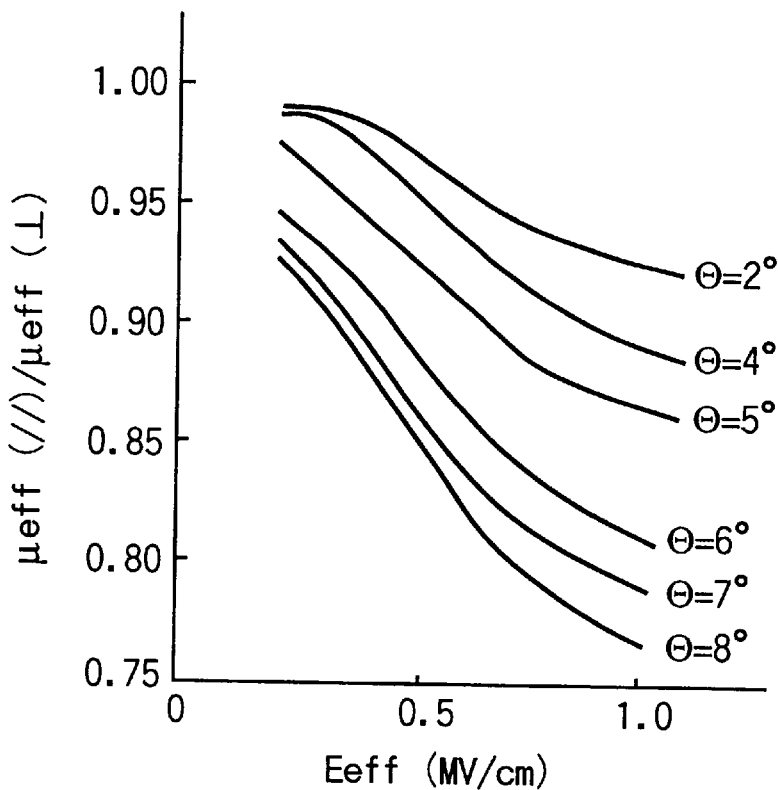
FIG. 21 is a diagram showing reduction in mobility on the substrate surface which has been polished off-axis.

FIG. 21 shows reduction in effective channel mobility μeff, measured in an MOSFET formed on an off-axis substrate obtained by rotating the Si (100) plane about the <011> axis by an angle θ. It is clear that the greater the off-axis angle θ, the smaller the mobility μeff, μeff is the mobility, in the direction in which the scattering due to the steps is greater (parallel to the predetermined direction).

In the case of Si, since the off-axis angle is generally set smaller than 1°, the number of steps is small, and anisotropy in channel mobility raises little problem. However, in the case of SiC, the off-axis angle is set to about 4° for step-controlled epitaxy and there are relatively great steps due to the characteristic periodical structure of the hexagonal system. As a result, a number of steps appear and considerable scattering occurs. Thus, the effective channel mobility is reduced to an extent which cannot practically be ignored, and the ON resistance is increased.

Further, if the surface of the epitaxial layer makes an angle with a crystal surface along a low index number direction axis macroscopically, and if a trench is formed without taking the direction thereof into consideration, the side wall of the trench is inevitably deviated from the crystal surface along the low index number direction axis. As a result, the lattice structure on the side walls is disordered and a number of dangling bonds are generated. For this reason, when a current path is formed on the side wall of the trench, the following problem is raised: the surface scattering becomes greater due to surface-roughness scattering and coulomb scattering, and the ON resistance is increased.

As described above, in the conventional semiconductor device, the current path of the device is formed without taking account of the stepped structure on the surface of an epitaxial layer. Therefore, if a vertical surface of the stepped structure is included in the current path, the ON resistance may be unexpectedly increased. Moreover, when a trench is formed, the side wall of the trench is deviated from the crystal surface along the low index number direction axis, resulting in an increase in the surface scattering and the ON resistance.

The sixth aspect of the present invention is conceived on the basis of the above problem, and its object is to provide a semiconductor device, in which a device region, formed on a monocrystalline semiconductor layer epitaxially grown on a semiconductor substrate polished at a predetermined angle, has a low ON resistance.

(Ninth Embodiment)

Figure 22:
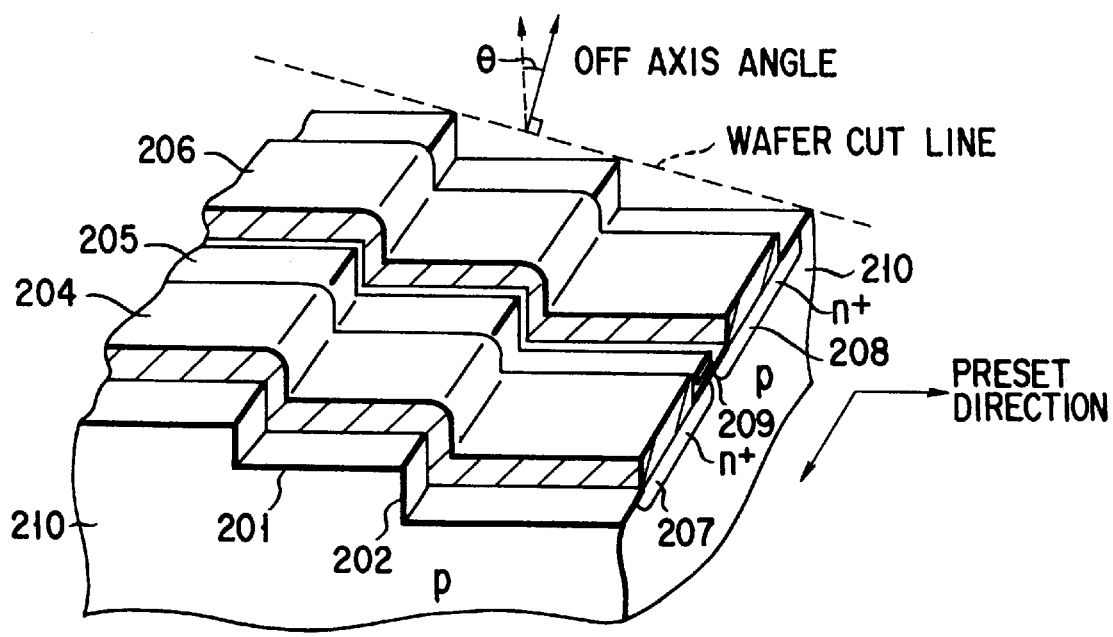
FIG. 22 is a perspective sectional view showing a device structure of an MOS transistor according to a ninth embodiment of the present invention.

FIG. 22 is a perspective sectional view showing a device structure of an MOS transistor according to a ninth embodiment of the present invention. According to this embodiment, a substrate is polished in a preset direction to make an off-axis angle θ to a low index number direction axis, thereby forming an off-axis substrate (not shown). A horizontal planer MOSFET is formed on a monocrystalline semiconductor layer epitaxially grown on the substrate, so that the main current direction is substantially perpendicular to the preset direction.

A terrace 201 and a vertical surface 202 of a step due to the off-axis angle θ are formed on the surface of the epitaxial layer. The surface of the terrace 201 coincides with the crystal surface of the low index number. An n-type layer of a high concentration for forming a source layer 207 and a drain layer 208 are formed in a p-type well layer 210 on the surface of the epitaxial layer. A gate electrode 205 is formed on a gate insulating film 209 formed on that portion of the well layer 210 which is interposed between the source layer 207 and the drain layer 208. A channel is formed under the gate electrode 205. The source layer 207, the drain layer 208 and the well layer 210 constitute a device region.

A source electrode 204 and a drain electrode 206 are respectively in contact with the source layer 207 and the drain layer 208 with a low resistance. The gate electrode 205 extends substantially parallel to the preset direction. Accordingly, the direction in which the main current flows, i.e., the channel length direction in which the controlled current flows, is substantially perpendicular to the preset direction.

According to this embodiment, since the main current flows substantially parallel to the vertical surface 202, the possibility of the carriers being scattered by the vertical surface is lowered, so that the reduction in channel mobility due to roughness scattering can be suppressed. Particularly, in a case of SiC, a number of steps appear and considerable scattering occurs, because the off-axis angle is set to about 4° for step-controlled epitaxy and the steps are considerably steep due to a characteristic periodical structure of a hexagonal system. In this case, the reduction in mobility is further suppressed by this embodiment. Thus, according to this embodiment, a stable device having a low ON resistance can be obtained.

(Tenth Embodiment)

Figure 23:
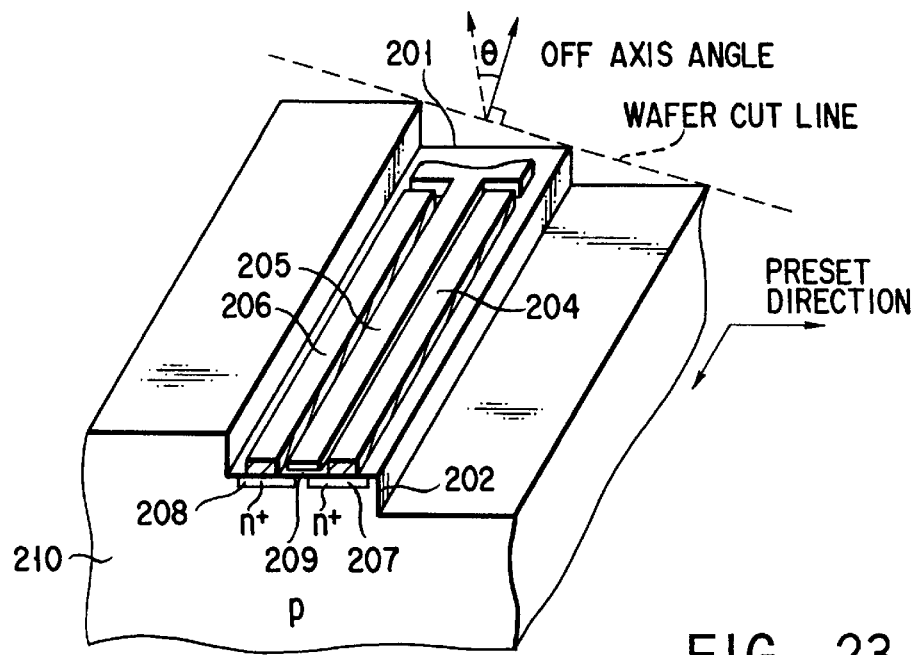
FIG. 23 is a perspective sectional view showing a device structure of an MOS transistor according to a tenth embodiment of the present invention.

FIG. 23 is a perspective sectional view showing a device structure of an MOS transistor according to a tenth embodiment of the present invention. In FIG. 23, the same or similar device as that in FIG. 22 is identified with the same reference numeral, and a detailed description thereof is omitted.

This embodiment is different from the ninth embodiment in that the horizontal planer MOSFET is formed on the surface of an epitaxial layer grown on the off-axis substrate (not shown) of an off-axis angle θ, such that a vertical surface 202 does not exist in the region where the main current flows. In other words, the main current of the horizontal planer MOSFET flows only on one terrace 201 so as not to flow across the vertical surface 202. A gate electrode 205 extends substantially perpendicular to the preset direction. Accordingly, the direction in which the main current flows, i.e., the channel length direction, is substantially parallel to the preset direction.

In this embodiment, since there is no vertical surface 202 in the region where the main current flows, the carriers are not scattered by a vertical surface, resulting in no reduction in channel mobility due to roughness scattering. In this embodiment, since the gate electrode 205 is parallel to the vertical surface 202, an MOSFET of a wide channel width can be formed comparatively easily.

In this case, although the channel where the controlled current flows does not extend across the vertical surface 202, the source layer 207 or the drain layer 208 may extend across the surface 202. Further, the gate electrode 205 is not necessarily parallel to the surface 202. So far as the channel does not extend across the surface 202, the same effect can be obtained; i.e., a stable device having a low ON resistance can be obtained.

(Eleventh Embodiment)

Figure 24:
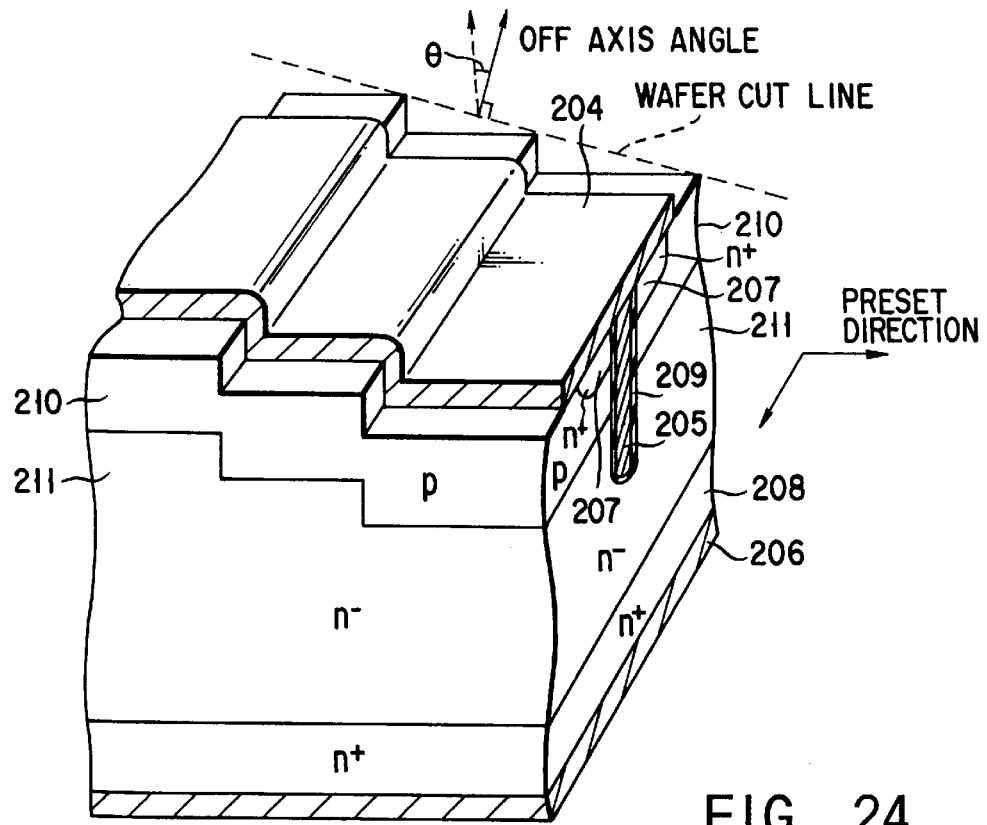
FIG. 24 is a perspective sectional view showing a device structure of an MOS transistor according to an eleventh embodiment of the present invention.

FIG. 24 is a perspective sectional view showing a device structure of an MOS transistor according to a eleventh embodiment of the present invention. In the semiconductor device of this embodiment, an n-type monocrystalline semiconductor layer of a low concentration, serving as a base layer 211, is epitaxially grown on an n-type off-axis substrate of a high concentration of an off-axis angle θ, serving as a drain layer 208. A p-type well layer 210 is formed on a surface of the epitaxial layer 211. A stripe trench deeper than the well layer 210 is formed substantially parallel to the preset direction. A gate insulating film 209 is formed on the walls of the trench and a gate electrode 205 is buried in the trench.

An n-type layer of a high concentration, serving as a source layer 207, is formed in that portion of the well layer 210 which is in contact with an upper portion of the trench. A source electrode 204 is in contact with both the source layer 207 and the well layer 210 with low contact resistance, and a drain electrode 206 is in contact with the drain layer 208 with low contact resistance. A channel is formed along the side wall of the trench between the base layer 211 and the source layer 207. Thus, the device formed by this embodiment is a vertical trench MOSFET.

According to this embodiment, the side wall of the stripe trench, along which the main current flows, is substantially parallel to the preset direction. Therefore, the side wall of the trench is a flat surface along a low index number direction in the atomic layer order. Further, since the carriers are not scattered by a vertical surface, resulting in no reduction in mobility due to roughness scattering. In this case, if the side wall of the trench is formed on a plane having a small number of interface states (the {100} plane in the case of Si or the {11–20} plane in the case of SiC), the reduction in mobility due to coulomb scattering can be suppressed to a minimum. Thus, according to this embodiment also, a stable device having a low ON resistance can be obtained.

The present invention is not limited to the embodiments as described above. Although the horizontal planer MOSFET and the vertical trench MOSFET have been described, the present invention can also be applied in the same manner to a vertical trench IGBT, which has a p-type layer between the drain layer 208 and the drain electrode 206 of the eleventh embodiment. It can also be applied to a horizontal planer IGBT, etc. Thus, the present invention can be modified variously without departing from the scope of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit of scope of the general inventive concept as defined by the appended claims and their equivalents.

We claim:

1. A semiconductor device comprising:

a silicon carbide substrate polished to have a tilt angle in a preset direction normal to a low index number direction axis;

a monocrystalline semiconductor layer epitaxially grown on the semiconductor substrate; and a device region formed on a surface of the monocrystalline semiconductor layer, said device region including an MOS structure having a source region, a drain region, and a gate electrode and a current path formed in a surface region of the monocrystalline semiconductor layer along a direction which is substantially perpendicular to the preset direction.

2. The semiconductor device according to claim 1, wherein the source region, the gate electrode, the drain region are aligned in order on the surface region of the monocrystalline semiconductor layer in a direction substantially perpendicular to the preset direction.

3. The semiconductor device according to claim 1, wherein the tilt angle is 4 degrees or more.

* * * * *